(12) United States Patent
Miura

(10) Patent No.: US 12,454,770 B2
(45) Date of Patent: Oct. 28, 2025

(54) EPITAXIAL SILICON WAFER AND METHOD FOR PRODUCING THE SAME

(71) Applicant: SUMCO CORPORATION, Tokyo (JP)

(72) Inventor: Masayuki Miura, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 18/966,952

(22) Filed: Dec. 3, 2024

(65) Prior Publication Data

US 2025/0179686 A1 Jun. 5, 2025

(30) Foreign Application Priority Data

Dec. 4, 2023 (JP) ................................. 2023-204700
Nov. 26, 2024 (JP) ................................. 2024-205250

(51) Int. Cl.
| | |
|---|---|
| B32B 3/10 | (2006.01) |
| B32B 3/20 | (2006.01) |
| C30B 15/20 | (2006.01) |
| C30B 25/20 | (2006.01) |
| C30B 29/06 | (2006.01) |
| C30B 30/04 | (2006.01) |
| H10D 62/60 | (2025.01) |

(52) U.S. Cl.
CPC ............... *C30B 25/20* (2013.01); *B32B 3/10* (2013.01); *B32B 3/20* (2013.01); *C30B 15/203* (2013.01); *C30B 29/06* (2013.01); *C30B 30/04* (2013.01); *H10D 62/60* (2025.01)

(58) Field of Classification Search
CPC .............................. C30B 29/06; C30B 15/203
See application file for complete search history.

(56) References Cited

U.S. PATENT DOCUMENTS

| | | | |
|---|---|---|---|
| 2006/0156969 A1* | 7/2006 | Hourai | C30B 29/06 |
| | | | 117/89 |
| 2018/0187751 A1* | 7/2018 | Dalgord | B60N 2/02246 |
| 2024/0352620 A1* | 10/2024 | Mangelberger | C30B 15/305 |

FOREIGN PATENT DOCUMENTS

| | | |
|---|---|---|
| JP | 3760889 B2 | 3/2006 |
| JP | 6493105 B2 | 4/2019 |

* cited by examiner

*Primary Examiner* — Elizabeth E Mulvaney
(74) *Attorney, Agent, or Firm* — GREENBLUM & BERNSTEIN, P.L.C.

(57) ABSTRACT

An epitaxial silicon wafer comprises a silicon wafer in which the entire surface, excluding an edge region from the outermost edge to 2 mm inward, is a COP region, and an epitaxial silicon layer formed on the surface of the silicon wafer. The average COP size in the peripheral region, located within 5 mm inward from the outermost edge of the silicon wafer, is 75 nm or less.

27 Claims, 11 Drawing Sheets

EPITAXIAL SILICON WAFER AND METHOD FOR PRODUCING THE SAME

TECHNICAL FIELD

The present invention relates to an epitaxial silicon wafer and a method for producing the same.

BACKGROUND ART

Epitaxial silicon wafers are widely used as substrate materials for semiconductor devices. An epitaxial silicon wafer is formed by creating a silicon epitaxial layer on a silicon wafer, and it has the characteristic of high crystal integrity.

Heavy metal impurities in epitaxial silicon wafers can cause defects in the characteristics of semiconductor devices, so it is desirable to minimize such impurities as much as possible. One technique for reducing the impact of heavy metal impurities is the gettering technique, which may be intrinsic gettering (IG), where oxygen precipitates (Bulk Micro Defects: BMD) are formed within the silicon wafer to capture the heavy metal impurities. In recent years, a BMD density of $1 \times 10^8/cm^3$ or more has been required for epitaxial silicon wafers to enhance gettering capability.

Patent Document 2 describes an epitaxial silicon wafer in which the nitrogen concentration is adjusted to $1 \times 10^{12}$-$1 \times 10^{13}$ atoms/$cm^3$, and a silicon epitaxial film is formed on the surface of the silicon wafer consisting of a COP region. The BMD density within the silicon wafer subjected to evaluation heat treatment ranges from $1 \times 10^8$ to $3 \times 10^9/cm^3$ across the entire radial direction of the wafer. Furthermore, the average BMD density in the peripheral region, defined in Patent Document 2 as within 1-10 mm inward from the outermost edge of the silicon wafer, is lower than that in the central region, and the variation in BMD density in the peripheral region is 3 or less. The residual oxygen concentration in the peripheral region is $8 \times 10^{17}$ atoms/$cm^3$ or more.

PRIOR ART DOCUMENTS

Patent Documents

[Patent Document 2] Japanese Patent No. 6493105

SUMMARY OF THE INVENTION

Problems to be Solved by the Invention

Most silicon single crystals, which are used as the substrate material for epitaxial silicon wafers, are manufactured by the Czochralski method (CZ method). Conventionally, in the production of silicon single crystals for epitaxial silicon wafers, priority was given to productivity over crystal quality, and silicon single crystals were pulled at the maximum pulling speed that did not cause crystal deformation. This was because it was thought that the crystal quality of the silicon substrate had very little effect on the quality of semiconductor devices, as the surface of the silicon substrate would be covered with an epitaxial silicon film.

However, the faster the pulling speed, the more Crystal Originated Particles (COP s) are generated in the silicon single crystal, and the larger the COP size becomes. COPs are void defects formed by the aggregation of vacancies, which are point defects, and the larger the COP size, the more vacancies are consumed in the silicon single crystal, leaving fewer residual vacancies. There is a proportional relationship between the residual vacancies and the BMD (bulk micro defect) density, so when the number of residual vacancies decreases the BMD density also decreases in the silicon wafer. An epitaxial wafer made from conventional silicon wafer (substrate) tends have lower BMD density particularly in the periphery, which in the present disclosure meaning within 5 mm inward from the outermost edge of the silicon wafer. A reduction in BMD density, which leads to a decrease in gettering capability, can result in lower semiconductor device yields. BMDs grow from BMD nuclei through the application of heat. The formation of BMDs further results from consuming residual vacancies. Therefore, a low number of residual vacancies may lower BMD densities.

Accordingly, an object of the present invention is to provide an epitaxial silicon wafer and a method for producing the same, capable of enhancing the uniformity of the distribution of BMD densities. In the present invention, the "BMD variation" means variation of BMD densities in an area of the wafer. The BMD variation may be quantified by taking the difference between the maximum BMD density and the minimum BMD density in an area of the wafer and then by dividing such a difference by the average BMD density in the area of the wafer. The measurements of BMD densities may be taken at an interval of 5 mm throughout most of the wafer. Near the edge of the wafer the BMD densities may be taken at a smaller interval such as 1 mm. The BMD variation referred to herein means an "in-plane" variation, which means that measurements are taken across a level plane of the wafer to measure the BMD densities.

Means for Solving the Problem

To solve the above-mentioned problem, the epitaxial silicon wafer according to the present invention comprises a silicon wafer having COPs and an epitaxial silicon layer formed on the surface of the silicon wafer. The wafer is characterized in that the average COP size in the peripheral region, which is located within 5 mm inward from the outermost edge of the silicon wafer, is 75 nm or less.

According to the present invention, it is possible to prevent the decreasing BMD densities in the peripheral region of the wafer caused by the increase in COP size. Therefore, an epitaxial silicon wafer with high gettering capability can be provided.

The average COP size in the central region of the silicon wafer is preferably 120 nm or less but greater than 100 nm. This improves the uniformity of the BMD density. Additionally, increasing the average COP size above 100 nm allows for a higher crystal pulling speed, which improves the productivity of the single crystal.

It is difficult to measure COPs near the edge of the wafer. In particular, measurements of COPs within 2 mm from the edge of the wafer ("edge region") may not be accurate. Thus, the presently disclosed BMD density may not be accurate in this edge region. However, as long as the remainder of the surface excluding the edge region contains COPs that are measurable, the effects of the present invention can be fully obtained.

After subjecting the wafer to an oxygen precipitation evaluation heat treatment of 780° C. for 3 hours and 1000° C. for 16 hours, the BMD density in the silicon wafer, excluding the edge region (i.e., within 2 mm from the edge), is preferably $5 \times 10^8/cm^3$ to $7 \times 10^9/cm^3$, and the BMD variation is preferably 0.6 or less. In another embodiment, the BMD variation is more preferably 0.5 or less. This allows for the provision of an epitaxial silicon wafer with uniformly high gettering capability across the wafer surface.

In one embodiment, the BMD variation may be determined by measuring BMD densities at an interval of 5 mm from the center to 139 mm in the radial direction, and at a 1 mm interval from 139 mm to 148 mm (herein designated as "outer region").

In another embodiment, in the range of 130 mm to 148 mm in the radial direction from the wafer center, the BMD density is preferably $5 \times 10^8/cm^3$ to $7 \times 10^9/cm^3$, and the BMD variation is preferably 0.35 or less. This allows for the provision of an epitaxial silicon wafer with uniformly high gettering capability across the wafer surface.

BMDs result from oxygen precipitates (Oi) in the wafer. The Oi concentration (measurable with ASTM_F121, 1979) in a 300 mm wafer is preferably $10 \times 10^{17}$ atoms/cm$^3$ to $14 \times 10^{17}$ atoms/cm$^3$ which allows for obtaining sufficient BMD density in the wafer.

After the oxygen precipitation evaluation heat treatment, the Oi concentration (ASTM_F121, 1979) in the peripheral region (i.e., the region located within 5 mm inward from the outermost edge of the silicon wafer) is preferably $8 \times 10^{17}$ atoms/cm$^3$ to $13 \times 10^{17}$ atoms/cm$^3$. This ensures the desired BMD density in the peripheral region of the wafer while suppressing a reduction in wafer strength due to a lack of residual oxygen concentration. Therefore, it is possible to prevent the occurrence of slip dislocations in the peripheral region of the wafer while ensuring the desired gettering capability through sufficient BMD densities.

The nitrogen concentration in the silicon wafer is preferably $3 \times 10^{12}$ atoms/cm$^3$ to $9 \times 10^{13}$ atoms/cm$^3$. A silicon wafer doped with nitrogen forms thermally stable oxygen precipitation nuclei during the growth stage of the silicon single crystal, which are less likely to disappear even during the high-temperature heat treatment in the epitaxial process, preventing a reduction in BMD density. As a method for measuring the nitrogen concentration, for example, SIMS (Secondary Ion Mass Spectrometry) or low-temperature FT-IR utilizing the infrared absorption spectrum of NO donors (nitrogen-oxygen complex donors) can be used.

The COP size of the silicon wafer may be measured using the LST (Light Scattering Tomography) method, where the laser light irradiated onto the silicon wafer has an output power of 100 mW, the transmittance of the ND filter used to reduce the amount of scattered light to within the dynamic range is between 20% and 50%, the scan distance of the laser light is 2000 μm, and the measurement depth of the scattered light is between 88.4 μm and 348.4 μm. This configuration improves the accuracy of COP measurements in the silicon wafer.

Generally, the size of COPs formed within a silicon wafer are not uniform. Also, the shape of a COP is typically octahedral and, therefore, the measurement of its size is difficult and requires certain estimation. In this invention, the COP size is defined as the diameter of a sphere that is estimated to have a similar volume as the COP being considered in the designated measurement area of the silicon wafer. First, the light intensity from a COP using the LST method is measured. Then, the sphere having the same light intensity is determined. Finally the size of the COP is deemed the diameter of such sphere. The average size of COPs is therefore the average diameter of multiple COPs (i.e., sum of diameters divided by the total number of COPs). In the preferred embodiment, the average size of COPs means the sum of 50 or more diameters (corresponding to 50 or more COPs) divided by the total number of COPs.

In measuring the average COP size, laser scanning is performed within a range of ±1000 μm in the radial direction from a measurement point. It is preferable that the average COP size is determined based on 50 or more COPs. If fewer than 50 COPs are identified in a single laser scan measurement, the scanning position is shifted circumferentially within the ±1000 μm range, and laser scanning is repeated until the cumulative number of COPs exceeds 50. This means that the measurement range is expanded circumferentially to assess the COPs.

The method for producing an epitaxial silicon wafer according to the present invention includes a step of growing a silicon single crystal using the Czochralski (CZ) method, a step of processing the silicon single crystal to form a 300 mm diameter silicon wafer, and a step of forming an epitaxial silicon film on the surface of the silicon wafer. The step of growing the silicon single crystal is characterized by satisfying the following Voronkov ratio (V/G):

$$0.1830 \leq V/G \leq (0.1035 \times CR1) - 0.0350, \text{ where}$$

$$2.105 \leq CR1 \leq 2.839$$

wherein V represents the pulling speed of the silicon single crystal (mm/min), G represents the temperature gradient in the direction of crystal growth from the silicon melting point (about 1412° C.) to 1350° C. (° C./mm), and CR1 represents the cooling rate at 1100° C. of the silicon single crystal (° C./min) at about 145 mm from the center axis of the crystal. A positive value of the cooling rate indicates that the temperature decreases over time, while a negative value indicates that the temperature increases over time.

According to the present invention, it is possible to produce a silicon wafer in which the average COP size in the peripheral region, located within 5 mm inward from the outermost edge, is 75 nm or less. Therefore, it is possible to prevent a decrease in the BMD density in the peripheral region of the wafer caused by an increase in the COP size, and to provide an epitaxial silicon wafer with uniformly high gettering capability across the entire surface.

In the present invention, it is preferable that the step of growing the silicon single crystal satisfies the following V/G conditions:

$$0.1740 \leq V/G \leq (0.1096 \times CR2) - 0.0387, \text{ where}$$

$$1.940 \leq CR2 \leq 2.624$$

wherein V represents the pulling speed of the silicon single crystal (mm/min), G represents the temperature gradient in the direction of crystal growth from the silicon melting point (about 1412° C.) to 1350° C. (° C./mm), and CR2 represents the cooling rate at 1100° C. of the silicon single crystal (° C./min) about the center axis of the crystal.

Furthermore, the method for producing an epitaxial silicon wafer according to the present invention includes the step of growing a silicon single crystal using the CZ method, a step of processing the silicon single crystal to form a 300 mm diameter silicon wafer, and a step of forming an epitaxial silicon film on the surface of the silicon wafer. The step of growing the silicon single crystal involves using a water-cooled body to cool the silicon single crystal pulled from the silicon melt so that the entire surface of the silicon wafer, excluding the edge region within 2 mm from the outermost edge, is a COP region, and the average COP size in the peripheral region located within 5 mm inward from the outermost edge of the silicon wafer is 75 nm or less. This is achieved under process conditions where the crystal pulling speed is 60 to 90% of the maximum pulling speed without causing crystal deformation or damages, the gap between the heat shield member and the melt surface is 40 to 80 mm, and the strength of the magnetic field applied near the solid-liquid interface is 2000 to 4000 Gauss.

According to the present invention, it is possible to produce a silicon wafer with an average COP size of 75 nm or less in the region within 5 mm from the edge ("peripheral region"). Therefore, it is possible to prevent decrease in BMD density in the peripheral region of the wafer caused by the increase in COP size, providing an epitaxial silicon wafer with uniformly high gettering capability across the wafer surface.

In the step of growing the silicon single crystal, it is preferable that the cooling rate CR1 (° C./min) at 1100° C. at a position 145 mm from the central axis of the crystal in the radial direction is in the range of $2.105 \leq CR1 \leq 2.839$. This ensures that the average COP size at the position 145 mm from the central axis of the crystal is 75 nm or less, improving the uniformity of the BMD density.

The method for producing an epitaxial silicon wafer according to the present invention further includes a step of experimentally determining the pulling speed of the silicon single crystal that results in an average COP size of 75 nm or less in the peripheral region by investigating the distribution of COPs in multiple silicon wafer samples taken from silicon single crystal samples pulled at various pulling speeds. This allows for the production of a silicon wafer with an average COP size of 75 nm or less in the peripheral region.

Effects of the Invention

According to the present invention, it is possible to provide an epitaxial silicon wafer and a method for producing the same, which can improve the uniformity of the distribution of BMD density.

BRIEF DESCRIPTION OF THE DRAWINGS

FIG. 1(a) is a schematic perspective view, and FIG. 1(b) is a schematic cross-sectional view.

FIG. 5(a) shows the distribution of the average COP size in Comparative Examples 1 to 3, and FIG. 5(b) shows the distribution of the average COP size in Examples 1 to 4.

FIG. 6(a) shows the distribution of the BMD density in Comparative Examples 1 to 3, and FIG. 6(b) shows the distribution of the BMD density in Examples 1 to 4.

FIG. 8(a) shows the measurement results of the oxygen concentration in Comparative Examples 1 to 3, and FIG. 8(b) shows the measurement results of the oxygen concentration in Examples 1 to 4.

FIG. 9(a) shows the distribution of the residual Oi concentration in a silicon wafer in Comparative Examples 1 to 3, and FIG. 9(b) shows the distribution of the residual Oi concentration in a silicon wafer in Examples 1 to 4.

DETAILED DESCRIPTION OF THE INVENTION

Hereinafter, the preferred embodiments of the present invention will be described in detail with reference to the accompanying drawings.

Figure 1A:
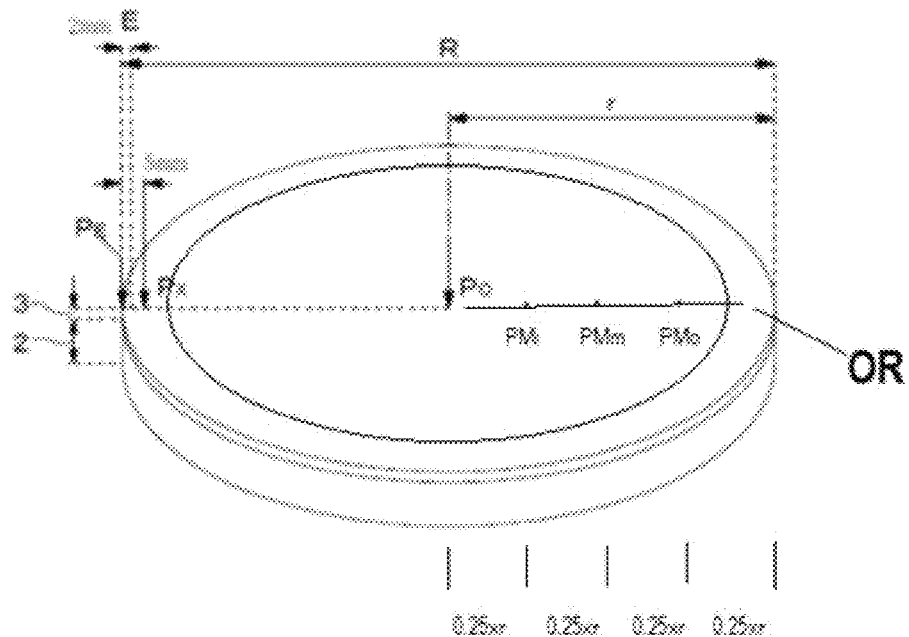
FIG. 1(a) and FIG. 1(b) are schematic views of an epitaxial silicon wafer according to an embodiment of the present invention, where
Figure 1B:
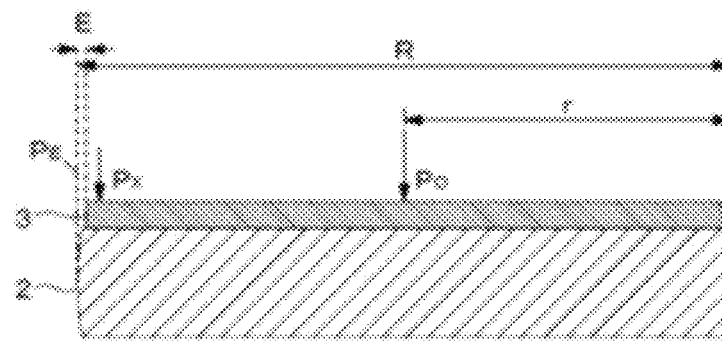

FIGS. 1(a) and 1(b) are schematic diagrams of an epitaxial silicon wafer according to an embodiment of the present invention, where FIG. 1(a) is a schematic perspective view, and FIG. 1(b) is a schematic cross-sectional view.

As shown in FIGS. 1(a) and (b), an epitaxial silicon wafer 1 consists of a silicon wafer 2 made of a silicon single crystal and an epitaxial silicon film 3 formed on the surface of the silicon wafer 2.

In a preferred embodiment, the silicon wafer 2 is made of a silicon single crystal grown by the CZ method, and its diameter R is 300 mm (radius r=150 mm). The silicon single crystal may be an n-type semiconductor doped with n-type dopants such as phosphorus, arsenic, or antimony, or it may be a p-type semiconductor doped with p-type dopants such as boron. The silicon wafer 2 contains nitrogen, and the nitrogen concentration is preferably $3 \times 10^{12}$ to $9 \times 10^{13}$ atoms/$cm^3$. Nitrogen-doped silicon single crystals form thermally stable oxygen precipitation nuclei during the growth stage of the silicon single crystal, which are resistant to high-temperature heat treatment during the epitaxial process, thus preventing a reduction in BMD density.

In a preferred embodiment, the silicon wafer 2 having a diameter of 300 mm includes COPs throughout. However, COPs in the edge region E (within 2 mm from the wafer edge PE), are difficult to measure. Also, in the preferred embodiment, the average COP size in the peripheral region PX (within 5 mm inward from the wafer edge PE), is 75 nm or less. The preferred average COP size at the center PO is 120 nm or less. The entire surface of the silicon wafer 2, excluding the edge region E, consists of a COP region, and the average COP size in the peripheral region PX located within 5 mm inward from the outermost edge PE of the silicon wafer 2 is preferably 75 nm or less. In the case of a 300 mm wafer, the measurement position of the COP in the peripheral region PX is a position 145 mm away from the center PO of the wafer in the radial direction. Furthermore, the average COP size at the center PO of the silicon wafer 2 is preferably 120 nm or less. As will be described in detail, the BMD density at the peripheral region PX is maintained at a high level and uniform by reducing the COP size.

COPs are void defects formed by the aggregation of vacancies. These are point defects and generally considered to have an octahedral shape. Therefore, the measurement of a COP size is complex and requires certain estimation. In this invention, the COP size is defined as the diameter of a sphere that is estimated to have a similar volume as the COP being considered in the designated measurement area of the silicon wafer. First, the light intensity from a COP using the LST method is measured. Then the sphere having the same light intensity is determined. Finally the size of the COP is deemed the diameter of such sphere. The average size of COPs is therefore the average diameter of multiple COPs (i.e., sum of diameters divided by the total number of COPs). In the preferred embodiment, the average size of COPs means the sum of 50 or more diameters (corresponding to 50 or more COPs) divided by the total number of COPs.

COPs may be measured from the silicon wafer 2 (or silicon substrate) preferably with the use of the light scattering tomography (LST) method. To determine the average size of COPs it is preferred that 50 or more COPs are taken for measurements in a space anywhere in the wafer. The particular depth or location in the wafer for this measurement is not critical.

In order to measure BMD densities and calculate the BMD variation, the epitaxial silicon wafer 1 is first heated at 780° C. for 3 hours and then at 1000° C. for 16 hours. The preferred BMD densities on the silicon wafer 2 thus measured are in the range of $5 \times 10^8$ to $7 \times 10^9 / cm^3$, and the preferred BMD variation is 0.6 or less. Here, the BMD variation (BV) is computed as:

BV=(Dmax−Dmin)/Davg, where

Dmax is maximum BMD density
Dmin is minimum BMD density
Davg is average BMD density The BMD densities are measured at a 5 mm interval from PO to the outer region (OR, See FIGS. 1(*a*) and 1(*b*)). As shown in FIGS. 1(*a*) and 1(*b*), OR is a region from 139 mm to 148 mm for a 300 mm wafer. Within OR, BMD densities are measured at a 1 mm interval.

Figure 12:
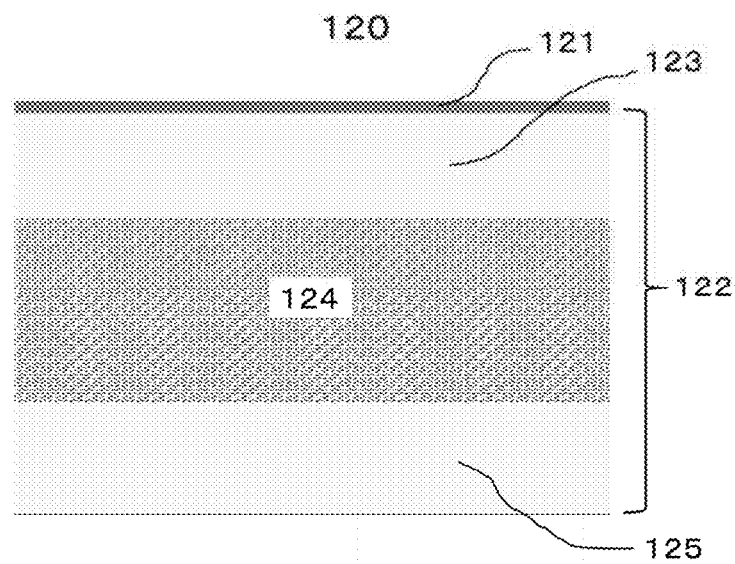
FIG. 12 depicts a cross-sectional view of the epitaxial wafer of the present invention featuring the gettering layer (bulk region) 124.

FIG. 12 depicts a cross-sectional view of the epitaxial wafer 120 of the present invention. The epitaxial wafer 120 comprises an epitaxial layer 121, silicon substrate 122. The epitaxial wafer 120 forms denuded zones (DZs) 123, 125 and a gettering layer (bulk region) 124 through heat. When heated, the gettering layer 124, which forms between the first denuded zone 123 and the second denuded zone 125, provides BMDs. The measurements of the BMD densities are taken from the gettering layer 124 at desired intervals as mentioned above. Preferably the BMD measurements are taken using the LST method. So long as the BMD measurements are taken from the gettering layer 124 particular depths or the location in the silicon substrate 122 is not critical.

The measurements of BMD densities may be taken at an interval of 5 mm throughout most of the wafer. However, toward the edge of the wafer, in the outer region from about 139 mm to about 148 mm from the center, the BMD densities may be taken at a smaller interval such as 1 mm.

As a result of diligent research, the inventors found that by controlling the size of COPs in the peripheral region of the silicon single crystal, it is possible to uniformize the distribution of BMD density. Regardless of the presence of nitrogen doping, BMD density depends on the density of residual vacancies after COP formation, but the density of residual vacancies tends to decrease toward the peripheral region of the silicon single crystal due to the outward diffusion of vacancies. Consequently, the BMD density tends to decrease toward the periphery of the silicon single crystal. However, the present inventors have discovered that the density of residual vacancies in the periphery of the silicon single crystal can be adjusted by controlling the size of COPs formed in the periphery.

Additionally, when the silicon melt is doped with nitrogen, BMD can be roughly divided into two types. One is BMD caused by nitrogen and vacancies aggregating before COP formation (hereinafter referred to as "NV precipitates"), and the other is BMD caused by residual vacancies after COP formation.

The BMD caused by NV precipitates depends on the distribution of vacancies before COP formation. Since the vacancy density decreases toward the periphery of silicon single crystal, the BMD density caused by NV precipitates also decreases toward the periphery of the silicon single crystal.

The BMD caused by NV precipitates is determined by the nitrogen concentration and the temperature gradient during crystal pulling, while the BMD caused by residual vacancies after COP formation can be adjusted by controlling the size of the COPs. In other words, by controlling the size of COPs in the periphery of the silicon single crystal, it is possible to adjust the BMD density caused by residual vacancies after COP formation in the periphery of the silicon single crystal. As a result, the final distribution of BMD density, which is the sum of the BMD density caused by NV precipitates and the BMD density caused by residual vacancies, can be made uniform.

Figure 2:
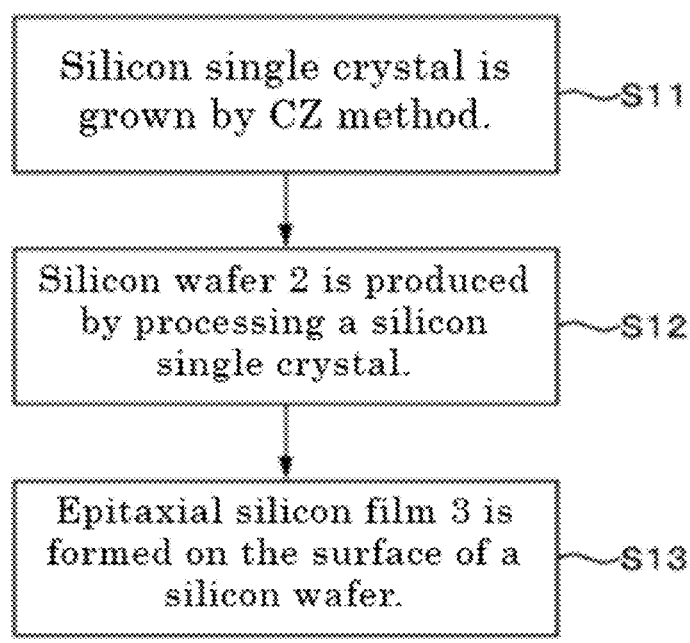
FIG. 2 is a flowchart schematically showing the method for producing an epitaxial silicon wafer.

FIG. 2 is a flowchart schematically showing the method for producing an epitaxial silicon wafer 1.

As shown in FIG. 2, the method for producing an epitaxial silicon wafer 1 includes a step S11 of growing a silicon single crystal using the CZ method, a step S12 of processing the silicon single crystal to produce a silicon wafer 2, and a step S13 of forming an epitaxial silicon film 3 on the surface of the silicon wafer 2.

In the step S11 of growing a silicon single crystal using the CZ method, a seed crystal is immersed in the surface of a silicon melt contained in a quartz crucible, and the seed crystal and the quartz crucible are rotated while the seed crystal is gradually pulled up, causing a large single crystal to grow from the lower end of the seed crystal. Specifically, the following steps are sequentially performed: a seeding step in which the seed crystal contacts the silicon melt, a necking step in which the crystal diameter is narrowed by the Dash-neck method, a shoulder growth step in which the crystal diameter is gradually increased until it reaches the desired diameter, a body growth step in which the desired diameter is maintained as the single crystal continues to grow, and a tail growth step in which the crystal diameter is gradually narrowed before being separated from the silicon melt.

When growing a silicon single crystal using the CZ method, the type and distribution of defects in the single crystal depend on what is known as the Voronkov ratio, V/G, where V is the pulling speed of the single crystal and G is the temperature gradient in the direction of crystal growth near the solid-liquid interface.

Figure 3:
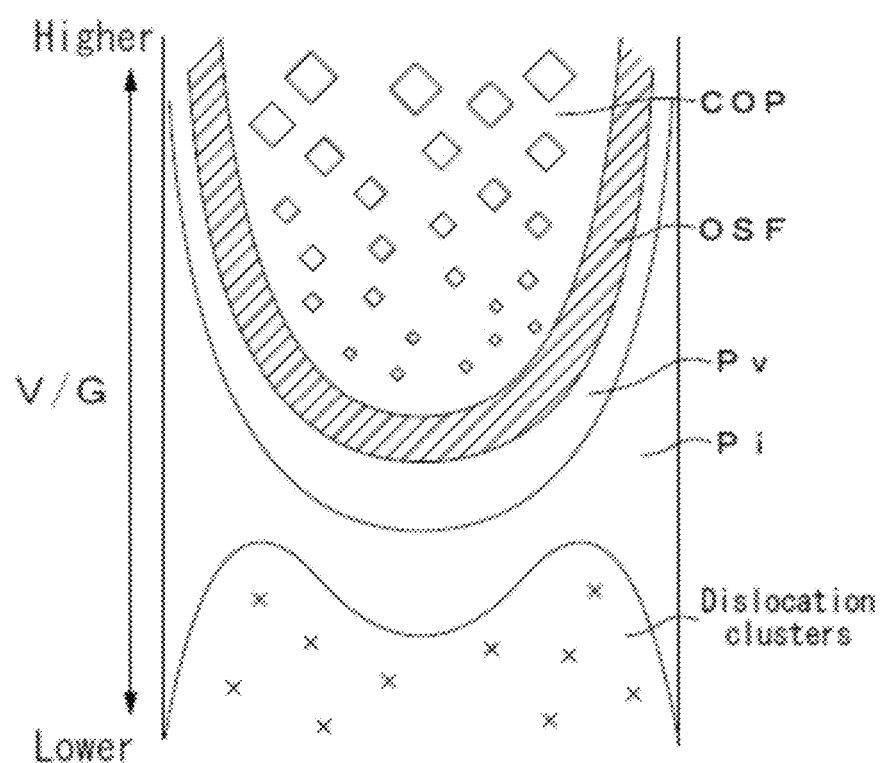
FIG. 3 is a diagram showing the general relationship between V/G and the types and distribution of crystal defects.

FIG. 3 is a diagram showing the general relationship between V/G and the types and distribution of crystal defects.

As shown in FIG. 3, when V/G is large, there is an excess of vacancies, leading to the formation of COPs, which are aggregates of vacancies. On the other hand, when V/G is small, there is an excess of interstitial silicon atoms, leading to the formation of dislocation clusters, which are aggregates of interstitial silicon. Both COPs and dislocation clusters are Grown-in defects that occur during crystal growth. Furthermore, between the regions where COPs and dislocation clusters form, there are three regions—OSF, Pv, and Pi—listed in order of increasing V/G. The OSF region is where OSFs (Oxidation-Induced Stacking Faults) occur when the crystal is thermally oxidized at high temperatures (1000-1200° C.). The Pv region and Pi region are defect-free regions that do not contain Grown-in defects. The Pv region contains oxygen precipitation nuclei in the as-grown state, and oxygen precipitates tend to form in this region when subjected to a two-step heat treatment at low and high temperatures (e.g., 800° C. and 1000° C.). The Pi region is a region where oxygen precipitates are unlikely to form, even when subjected to a two-step heat treatment.

The range of V/G that allows the growth of silicon single crystals without Grown-in defects is very narrow, so strict control of V/G is necessary to grow such crystals. V/G must be controlled to fall within the appropriate range in both the radial and axial directions of the single crystal. Since the pulling speed V is constant at all positions in the radial direction of the single crystal, the hot zone inside the CZ furnace must be designed so that the temperature gradient G falls within the prescribed range. To keep V/G within the appropriate range, the pulling speed V must be strictly controlled to be within the specified range.

Thus, controlling the pulling process of a silicon single crystal without Grown-in defects is very delicate. However, in the case of epitaxial silicon wafers, since the surface of the silicon wafer 2 is covered with the epitaxial silicon film 3 and the crystal integrity of the wafer surface is high, the silicon wafer 2 does not necessarily need to be defect-free, and it can contain Grown-in defects. Therefore, conventionally, the silicon single crystal was pulled at the maximum possible pulling speed to prioritize production efficiency, specifically at the maximum pulling speed that would not cause deformation of the crystal. The maximum pulling speed refers to the highest speed that can be achieved while maintaining the straight shape of the cylindrical body of the crystal in the longitudinal direction. Specifically, this refers to the maximum pulling speed at which the eccentric distance of the center of the horizontal cross-section of the cylindrical body does not exceed 4 mm from the line connecting the center points of the horizontal cross-sections at both ends of the cylindrical body.

In contrast, the preferred pulling speed of the present invention is in the range of 60 to 90% of the conventional maximum speed. Such slower pulling speed helps to maintain the average COP size in the peripheral region PX relatively small at 75 nm or less. This range of pulling speed may be determined by measuring COP sizes of multiple wafer samples from crystals of varying pulling speeds. In other words, the pulling speed that results in an average COP size of 75 nm or less in the peripheral region PX of the silicon wafer 2 can be experimentally determined before the step of growing the silicon single crystal.

For example, by repeatedly performing the pulling process of a silicon single crystal and evaluating the distribution of COPs in the crystal, the relationship between the crystal pulling speed and the average COP size in the peripheral region of the wafer can be determined in advance. This allows the identification of the appropriate pulling speed at which the average COP size in the peripheral region of the wafer becomes 75 nm or less. For instance, if the COPs in the peripheral region of a wafer sample pulled at a certain speed are larger than 75 nm, the pulling speed is adjusted lower or higher based on the predetermined relationship between the crystal pulling speed and the average COP size in the peripheral region to reduce the average COP size, and the silicon single crystal is pulled again. By repeating this process of pulling the silicon single crystal and evaluating the distribution of COPs, the appropriate pulling speed that results in an average COP size of 75 nm or less in the peripheral region of the wafer can be identified.

Figure 4:
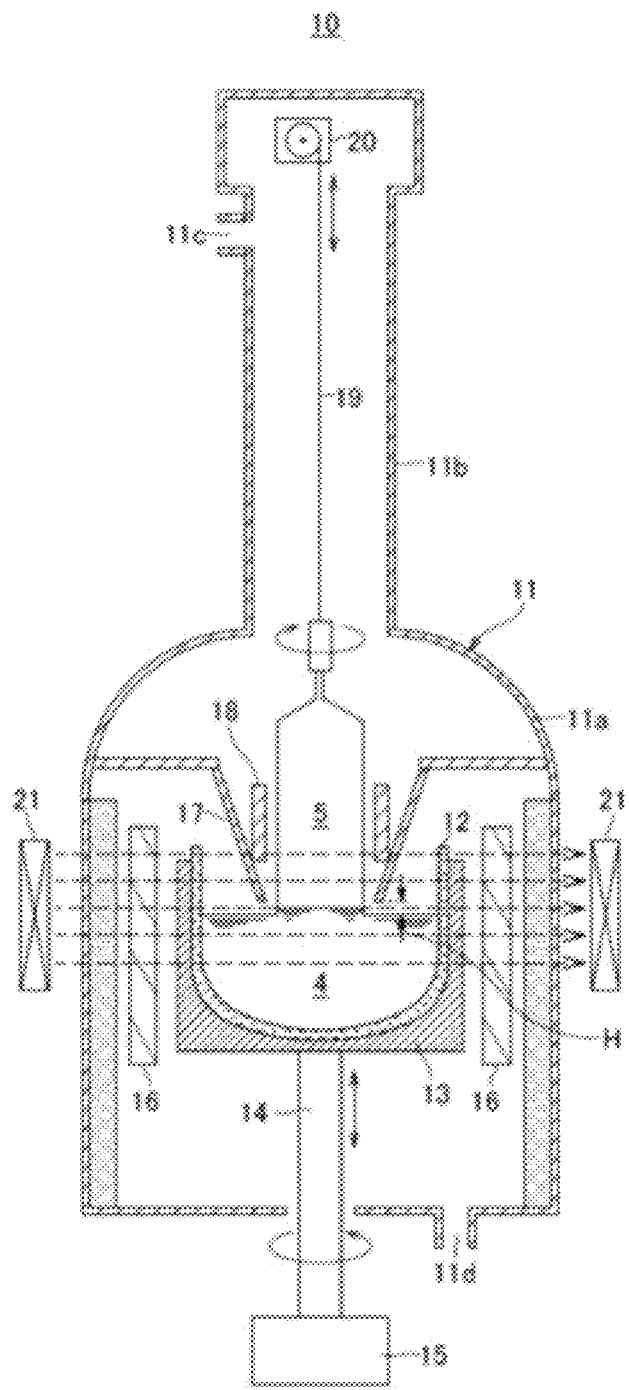
FIG. 4 is a cross-sectional view schematically showing the structure of a single-crystal pulling apparatus used in the production of a silicon single crystal by the CZ method.

FIG. 4 is a cross-sectional diagram schematically showing the configuration of the single crystal pulling apparatus used for producing silicon single crystals by the CZ method.

As shown in FIG. 4, the single crystal pulling apparatus 10 includes a chamber 11 (CZ furnace), a quartz crucible 12 for holding the silicon melt 4 inside the chamber 11, a carbon susceptor 13 for supporting the quartz crucible 12, a rotating shaft 14 supporting the carbon susceptor 13, a shaft drive mechanism 15 for rotating and moving the rotating shaft 14 up and down, a heater 16 arranged around the carbon susceptor 13, a heat shielding member 17 arranged above the quartz crucible 12, a cylindrical cooling system 18 arranged inside the heat shielding member 17, a wire 19 for pulling the single crystal arranged coaxially with the rotating shaft 14 above the quartz crucible 12, and a wire winding mechanism 20 arranged above the chamber 11. The single crystal pulling apparatus 10 is also equipped with a magnetic field generating device 21 arranged outside the chamber 11.

The chamber 11 consists of a main chamber 11a and an elongated cylindrical pull chamber 11b connected to the upper opening of the main chamber 11a. The quartz crucible 12, carbon susceptor 13, heater 16, heat shielding member 17, and cooling system 18 are all located inside the main chamber 11a. A gas inlet 11c for introducing inert gases (e.g., argon) or dopant gases into the main chamber 11a is located at the top of the pull chamber 11b, and a gas outlet 11d for discharging the atmosphere inside the main chamber 11a is located at the bottom of the main chamber 11a.

The quartz crucible 12 is a quartz glass container with cylindrical side walls and a curved bottom. The carbon susceptor 13 is used to maintain the shape of the quartz crucible 12, which softens at high temperatures, and it holds the entire circumference of the bottom and outer surface of the quartz crucible 12. Together, the quartz crucible 12 and the carbon susceptor 13 form a double-walled crucible that supports the silicon melt inside the chamber 11.

The carbon susceptor 13 is fixed to the upper end of the rotating shaft 14, whose lower end passes through the bottom of the chamber 11 and is connected to the shaft drive mechanism 15 located outside the chamber 11.

The heater 16 is used to melt the polysilicon material filled in the quartz crucible 12 to generate the silicon melt 4 and to maintain the molten state of the silicon melt 4. The heater 16 is a resistance heating carbon heater and is arranged around the quartz crucible 12 inside the carbon susceptor 13.

The heat shielding member 17 is installed to suppress temperature fluctuations in the silicon melt 4 and form an appropriate hot zone near the crystal growth interface, as well as to prevent the silicon single crystal 5 from being heated by radiant heat from the heater 16 and the quartz crucible 12. The heat shielding member 17 is a substantially cylindrical graphite component and is arranged to cover the area above the silicon melt 4, excluding the pulling path of the silicon single crystal 5.

The diameter of the opening at the lower end of the heat shielding member 17 is larger than the diameter of the silicon single crystal 5, ensuring that the pulling path of the silicon single crystal 5 is secured. Additionally, the outer diameter of the lower end of the heat shielding member 17 is smaller than the diameter of the quartz crucible 12, so the lower end of the heat shielding member 17 is positioned inside the quartz crucible 12. This prevents interference between the heat shielding member 17 and the quartz crucible 12, even if the upper rim of the quartz crucible 12 is raised above the lower end of the heat shielding member 17.

The gap H between the heat shielding member 17 and the silicon melt 4 is preferably 40 to 80 mm. Keeping this gap within this range contributes to form the same type of crystal defect (e.g., COP) across the radial direction of the single crystal. This enhances the yield of epitaxial silicon wafers in which COP defects are formed across the entire wafer surface.

The cooling system 18 is a cylindrical component surrounding the pulling path of the silicon single crystal 5. In one embodiment, the cooling system 18 comprises a liquid-cooled jacket such as a water-cooled jacket. In the preferred embodiment the cooling system 18 is positioned in the path where the outer portion of the crystal reaches 1100° C. and where the COPs, in the absence of any temperature control, are formed too large and adversely affect the BMD densities. Without appropriate temperature control, the wafers from a conventional crystal manifest decreased BMD densities at the peripheral region PX and the lack of effective gettering. The cooling system 18 of the present invention controls the cooling rate of the crystal at the 1100° C. juncture and helps to maintain smaller COP sizes particularly in the outer portion of the crystal and, in turn, the peripheral portion PX of the resulting wafer.

The wire winding mechanism 20 is located above the pull chamber 11b, and the wire 19 extends downward from the wire winding mechanism 20 through the pull chamber 11b, with the tip of the wire 19 reaching the internal space of the main chamber 11a. The figure shows the silicon single crystal 5 being suspended from the wire 19 during its growth. During the pulling of the silicon single crystal 5, the quartz crucible 12 and the silicon single crystal 5 are rotated, and the wire 19 is gradually pulled upward to grow the silicon single crystal 5.

As the silicon single crystal 5 grows, the amount of silicon melt in the quartz crucible 12 decreases. However, by raising the quartz crucible 12 to maintain a constant melt surface level, the gap H between the heat shielding member 17 and the melt surface can be kept constant, improving the stability of the temperature gradient G in the crystal growth direction from the silicon melting point to 1350° C.

The magnetic field generating device 21 applies a horizontal magnetic field to the silicon melt 4. The intensity of the magnetic field applied near the solid-liquid interface is preferably 1500 to 6000 G, and more preferably 2000 to 4000 G. By applying a magnetic field near the solid-liquid interface, convection of the melt in the direction perpendicular to the magnetic field lines can be suppressed. For example, the "near the solid-liquid interface" region can refer to a point 30 mm below the intersection of the solid-liquid interface and the crystal center axis.

The preferred magnetic field intensity near the solid-liquid interface is 2000 to 4000 G. Applying a magnetic field of 2000 to 4000 G to the silicon melt in the crucible stabilizes the convection in the silicon melt 4, further improving the stability of the crystal pulling speed and contributing to control the size of the COPs formed in the single crystal.

To begin the production of the silicon single crystal 5, the quartz crucible 12 is placed inside the carbon susceptor 13, and polycrystalline silicon material is loaded into the quartz crucible. The material inside the quartz crucible 12 is then heated by the heater 16 and melted to produce the silicon melt 4. Next, the seed crystal attached to the lower end of the wire 19 is lowered into the silicon melt 4. After that, the seed crystal is gradually pulled up while maintaining contact with the silicon melt 4, allowing the silicon single crystal 5 to grow. In the crystal growth process, after the shoulder section is formed by gradually increasing the diameter, the diameter is maintained to form the cylindrical section. After forming a cylindrical section of the desired length, the diameter is gradually decreased, and the single crystal is separated from the silicon melt 4. This completes the silicon single crystal ingot.

When using the cooling system 18 during the growth of the single crystal, controlling the pulling speed to be within the range of 60 to 90% of the maximum pulling speed allows the cooling rate at 1100° C. at a position 145 mm from the crystal center axis (i.e., the peripheral region on a 300 mm wafer) to be controlled within the range of 2.105 to 2.839° C./min. This allows COP defects to form in the single crystal, particularly enabling the average COP size in the peripheral region of the single crystal to be reduced to 75 nm or less.

The reason for controlling the crystal cooling rate at 1100° C. is as follows. When the silicon melt solidifies at the solid-liquid interface to form the single crystal, vacancies are incorporated into the single crystal. As the crystal cools during the growth, the vacancies in the single crystal become supersaturated, forming COP defects, which are aggregates of vacancies. COP formation occurs at around 1100° C. Therefore, by increasing the cooling rate at 1100° C., the COP size can be efficiently reduced.

As described above, the method for producing a silicon single crystal according to this embodiment pulls the silicon single crystal at a specified pulling speed, where the average COP size in the peripheral region is 75 nm or less, enabling the production of a silicon single crystal with high BMD density in the outer region and uniform distribution of BMD density.

Next, the silicon single crystal 5 is processed into a silicon wafer 2 (polished wafer) (step S12 in FIG. 2). The silicon wafer 2 is produced by cutting the silicon single crystal ingot into a predetermined block size, rounding the crystal diameter (outer diameter grinding), and then undergoing slicing, beveling, lapping, etching, polishing, and cleaning processes. The entire surface of the processed silicon wafer 2 consists of COPs, and the average COP size in the peripheral region is 75 nm or less.

The COP region refers to the area where COPs are detectable by the observation and evaluation described below. First, the silicon wafer undergoes SC-1 cleaning (i.e., cleaning with a mixture of ammonia water, hydrogen peroxide, and ultrapure water in a ratio of 1:1:15). The surface of the cleaned silicon wafer is then observed and evaluated using a surface defect inspection device (e.g., SURFSCAN SP-2 from KLA-Tencor), and bright spot defects (LPD: Light Point Defects), which are presumed to be surface pits, are identified. The observation mode is set to Oblique mode (oblique incidence mode), and surface pits are estimated based on the detection size ratio of the Wide Narrow channel. The identified LPDs are then evaluated using an Atomic Force Microscope (AFM) to determine whether they are COPs. The area where COPs are observed by this observation and evaluation is defined as the COP region. If LPDs are observed across the entire surface of the wafer, excluding the edge region within 2 mm from the outermost edge, and the LPDs at the center and 5 mm inside from the outermost edge of the wafer are identified as COP defects by AFM, then the entire surface of the wafer, excluding the edge region within 2 mm from the outermost edge, may be considered a COP region.

Next, an epitaxial silicon film 3 is formed on the surface of the silicon wafer 2 (step S13 in FIG. 2). The thickness of the epitaxial silicon film 3 is preferably between 0.2 and 10 μm. The method of forming the epitaxial silicon film 3 is not particularly limited, but for large-diameter silicon wafers with a diameter of 300 mm or more, single-wafer CVD (Chemical Vapor Deposition) equipment is preferably used. The silicon wafer 2 is set in the chamber of the CVD apparatus, and raw material gas such as trichlorosilane ($SiHCl_3$), together with carrier gas such as $H_2$ gas and dopant gas, is introduced into the chamber. Silicon is deposited on the silicon wafer 2 heated to 1000-1200° C. at a deposition rate of 0.5-6.0 μm/min through the thermal decomposition or reduction of the raw material gas. Afterward, the silicon wafer is cleaned, completing the epitaxial silicon wafer 1.

The BMD density distribution of the epitaxial silicon wafer 1 thus produced can be confirmed by performing an evaluation heat treatment (oxygen precipitation evaluation heat treatment) simulating the device process, which grows oxygen precipitation nuclei. BMDs in the silicon wafer 2 can be observed after the oxygen precipitation evaluation heat treatment by cleaving the wafer in the thickness direction and observing it using the LST method (Light Scattering Tomography). In this embodiment, the BMD density in the silicon wafer 2 after the oxygen precipitation evaluation heat treatment is between $5\times10^8/cm^3$ and $7\times10^9/cm^3$, with the BMD variation of 0.6 or less.

As described above, the epitaxial silicon wafer 1 according to the present invention comprises a silicon wafer 2 having COPs and an epitaxial silicon film 3 formed on the surface of the silicon wafer 2. The average COP size in the peripheral region PX, located 5 mm inward from the edge PE of the silicon wafer 2, is 75 nm or less. This prevents a decrease in BMD density in the peripheral region of the wafer and improves the uniformity of the distribution of BMD densities.

The above explanation describes a preferred embodiment of the present invention. However, the present invention is not limited to the embodiment described above and can be modified in various ways without departing from the spirit of the invention. These modifications are also within the scope of the present invention.

For example, in the above embodiment, an epitaxial silicon wafer with a diameter of 300 mm is used as an example, but the present invention is not limited to wafers with such a diameter. Wafers smaller than 300 mm, such as 200 mm wafers, or larger wafers, such as 450 mm wafers, may also be used.

EXAMPLES

Various crystals were used to achieve wafers of the present invention and compile data thereto. Nitrogen concentration of $3\times10^{12}$ to $9\times10^{13}$ atoms/$cm^3$ was added in each of the silicon melt from which the sample crystals were pulled.

A cooling system 18 (see FIG. 4) was used in pulling each of the crystals and to show reduction of COP sizes in the peripheral regions of the resulting wafers. In contrast, the cooling system 18 was not used in the samples of conventional crystals (Comparative Examples). In both the inventive samples and the comparative samples, magnetic field of 2000 to 4000 G were used. Again, in both samples, the crystal rotation speed was 8.5 to 10 rpm and the crucible rotation speed was 0.2 to 0.4 rpm.

For the inventive samples, crystals were pulled at 60 to 90% of the maximum pulling speed to ensure formation of COPs throughout the wafer surface and the smaller COPs particularly at the peripheral region. Speeds beyond the maximum pulling speed cause structure deformation to the crystal. The maximum pulling speed was used for the conventional comparative samples.

300 mm wafer samples A1 to A6 and B1 to B3 were taken from various crystals that were grown using the methods of the present invention.

Next, an epitaxial silicon film with a thickness of about 2 μm was formed on the surface of silicon wafer samples A1 to A6 and B1 to B3 by CVD, completing the epitaxial silicon wafers (epitaxial wafers) of Examples 1 to 6 and Comparative Examples 1 to 3.

Next, the distribution of COP, BMD density, and oxygen concentration in the epitaxial wafers of Examples 1 to 6 and Comparative Examples 1 to 3 was evaluated.

The distribution of COP was evaluated using the LST method with an infrared scattering tomography device (Mitsui Mining & Smelting Co., Ltd.: MO-441). In the LST method, the wafer is cleaved, and an infrared laser light is irradiated on the surface of the wafer. The size and density of defects within the wafer are measured by receiving the scattered light emitted from the cleaved surface using a CCD sensor.

The CCD sensor captures the cleaved surface through an ND filter. The CCD sensor outputs the intensity of light scattered by the micro-defects in the wafer as an electric signal with a 16-bit scale (65536 gradations), and the maximum value of the electric signal is taken as the scattering intensity. The scattering intensity is a relative value proportional to the sixth power of the COP size. The COP size is determined by referring to a calibration table showing the relationship between scattering intensity and COP size. As described above, the average COP size is calculated as the average of the diameters of multiple COPs present in the measurement area.

The conditions for measuring COPs with the infrared scattering tomography device were as follows: laser light output level of 100 mW, ND filter transmittance of 20-50% to reduce the amount of scattered light, laser scan distance along the cleaved surface of 2000 μm, and measurement depth of the scattered light in the depth direction from the surface of the epitaxial film of 88.4-348.4 μm. The measurement points for COP were the wafer surface irradiated from the epitaxial film side at 0 mm, 37.5 mm (¼×r), 75 mm (½×r), 112.5 mm (¾×r), and 145 mm (r-5 mm) from the center of the epitaxial wafer in the radial direction. The average COP size at each position was determined.

The distribution of BMD density was evaluated using the LST method with an infrared scattering tomography device (Semilab: LST-310A) after sequentially performing oxygen precipitation evaluation heat treatment (780° C.×3 h+1000° C.×16 h in an O2 atmosphere) and oxide film removal treatment on the epitaxial wafer. The measurement conditions for BMD density were: laser light output level of 51 µW, laser beam diameter of 8 µm, laser scan distance along the cleaved surface of 375 µm, measurement depth of the scattered light from the surface of the epitaxial film in the depth direction of 76.5-280.5 µm, and depth of 8 µm. The measurement was performed in the radial direction from the center of the wafer, starting from the center and measuring every 5 mm from 0 to 139 mm and every 1 mm from 139 to 148 mm (outer region).

In measuring BMD density, laser scanning was performed within a range of +188 µm in the radial direction from a measurement point on the wafer. BMD density was calculated by dividing the number of BMDs contained within a rectangular volume formed by the scan distance (width), laser spot diameter (depth), and a specified distance in the depth direction by the volume of the rectangle, which corresponds to the number of BMDs per unit volume (cm$^3$). By expanding the scan area to increase the number of BMDs, the measurement accuracy of BMD density can be improved.

The evaluation of the distribution of oxygen concentration was conducted for both the wafers before and after oxygen precipitation evaluation heat treatment. The distribution of oxygen concentration was measured using an FT-IR device (QS1200LTS) at 5 mm intervals from the center of the wafer to a radius of 145 mm.

The results are shown in the following Tables. Referring again to FIGS. 1(a) and 1(b), where point PO denotes the center point of the wafer, PE denotes the edge of the wafer, PX denotes 5 mm inside of PE, the region between 2 mm from PE and PX is denoted as the outer region, PMi denotes a distance of 0.25×r from PO, where r is the wafer radius, PMm denotes 0.5×r from PO, and PMo denotes 0.75×r from PO. With these points established, Examples 1-4 and Comparative Examples 1-3 are summarized as follows.

Table 1 displays the average sizes of COPs for the conventional wafers of Comparative Examples 1 to 3. Table 2 displays average sizes of COPs at various locations on the inventive wafers of Examples 1-4. The average sizes of COPs of the wafers of the present invention at PX range from 65.5 to 71.9 nm, whereas the conventional wafers feature significantly larger averages in the range of 79.6 to 85.7 nm. Also, at PO, the averages of the present invention range 103.8 to 119.8 nm versus 141.8 to 145.0 nm of the conventional wafers. Overall, wafers of the inventive Examples comprise smaller COPs over the entire wafer and improve BMD variation.

TABLE 1

| Distance from the center of wafer (mm) | | Average size of COPs (nm) | | |
|---|---|---|---|---|
| | | Comparative example 1 | Comparative example 2 | Comparative example 3 |
| 0 | (PO) | 145.0 | 143.0 | 141.8 |
| 37.5 | (PMi) | 144.8 | 137.9 | 136.5 |
| 75 | (PMm) | 126.0 | 117.7 | 126.1 |
| 112.5 | (PMo) | 115.3 | 110.1 | 108.8 |
| 145 | (PX) | 85.7 | 84.8 | 79.6 |
| Ratio | (PO/PX) | 1.69 | 1.69 | 1.78 |

TABLE 2

| Distance from the center of wafer (mm) | | Average size of COPs (nm) | | | |
|---|---|---|---|---|---|
| | | Example 1 | Example 2 | Example 3 | Example 4 |
| 0 | (PO) | 119.8 | 115.4 | 103.8 | 112.6 |
| 37.5 | (PMi) | 113.4 | 109.1 | 103.8 | 97.2 |
| 75 | (PMm) | 103.6 | 99.5 | 96.8 | 98.1 |
| 112.5 | (PMo) | 92.9 | 90.0 | 92.9 | 88.4 |
| 145 | (PX) | 71.9 | 70.5 | 65.5 | 68.0 |
| Ratio | (PO/PX) | 1.67 | 1.64 | 1.58 | 1.66 |

Figure 5A:
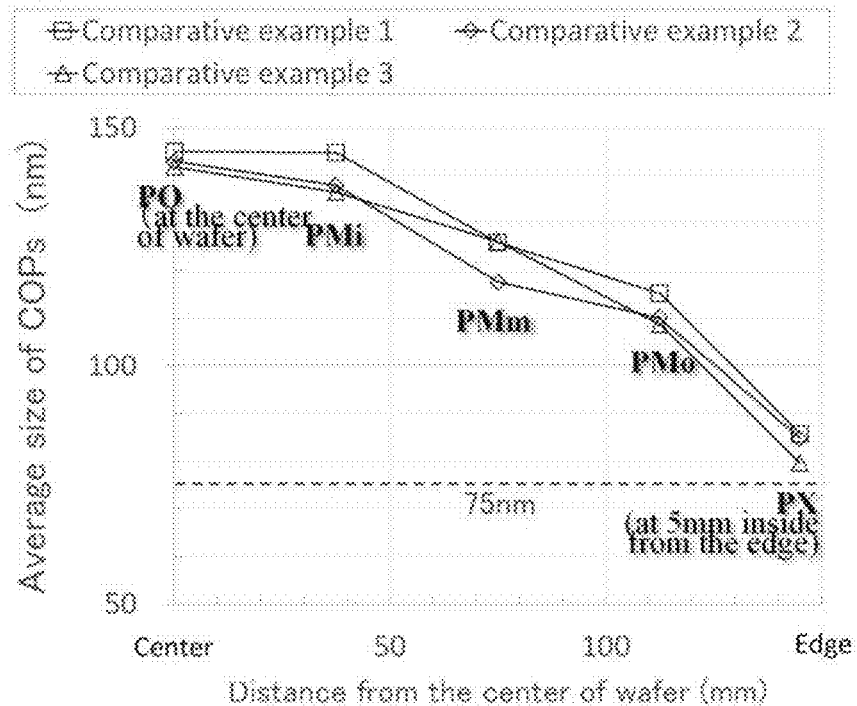
FIG. 5(a) and FIG. 5(b) each show the distribution of the average COP size of an epitaxial wafer, where
Figure 5B:
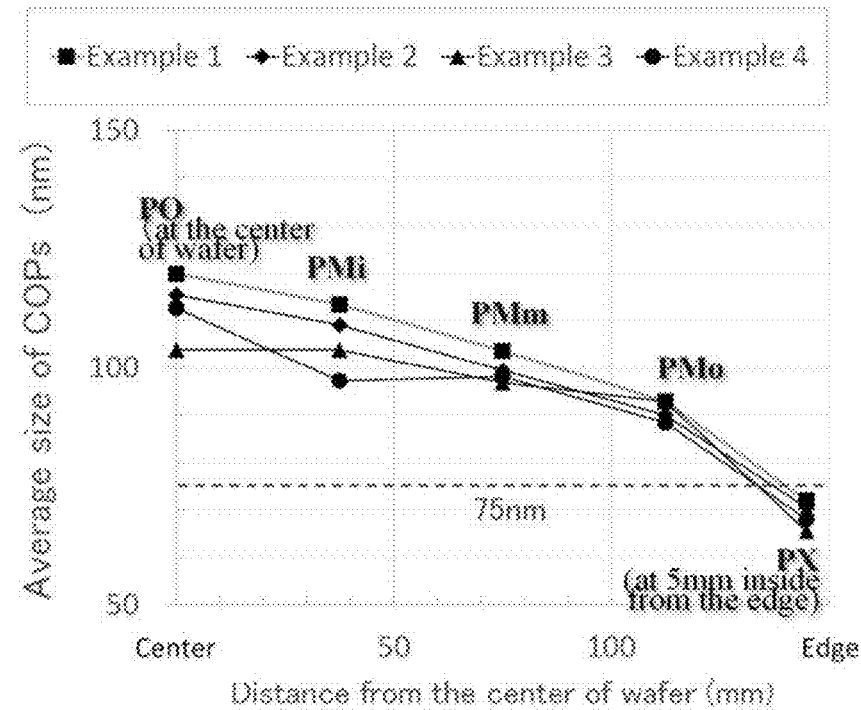

FIGS. 5(a) and 5(b) each graphically show the above-described distribution of the average COP size in the epitaxial wafers.

In FIG. 5(a), the average COP sizes for the conventional wafers of Comparative Examples 1 to 3 are in the range of 141.8 to 145.0 nm at the wafer center, and 79.6 to 85.7 nm at the peripheral region (at about 145 nm from the wafer center). FIG. 5(b) shows that the average COP sizes for the inventive wafers of Examples 1 to 4 are in the range of 103.8 to 119.8 nm at the wafer center, and 65.5 to 71.9 nm at the peripheral region (at about 145 mm from the wafer center). FIG. 5(b) shows that the average COP sizes for the inventive wafers are significantly smaller than those of the conventional wafers. Also FIG. 5(b) shows that the average COP sizes at the peripheral region are all less than 75 nm.

Figure 6A:
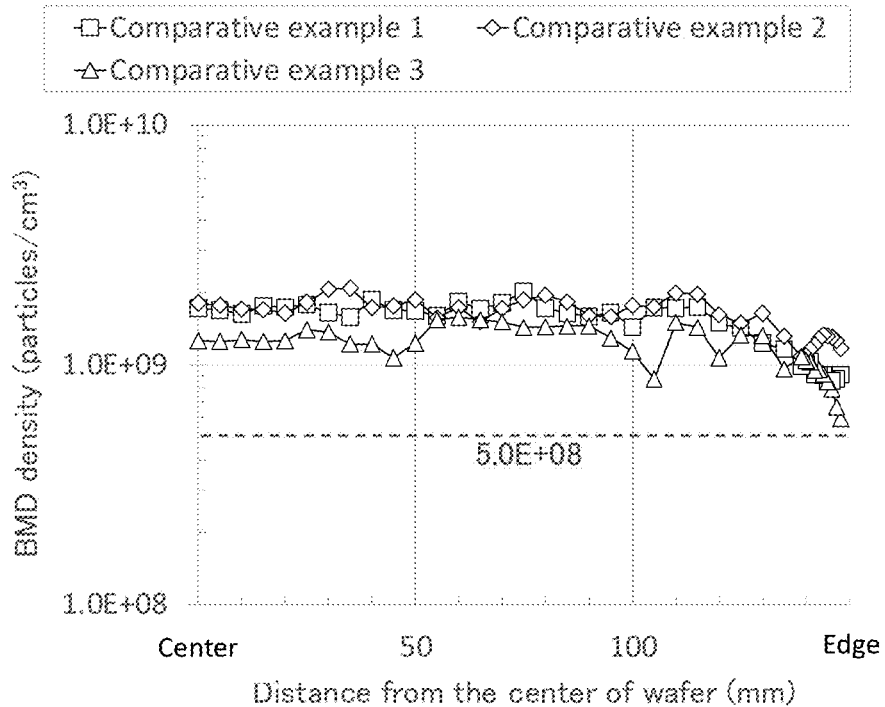
FIG. 6(a) and FIG. 6(b) each show the distribution of the BMD density of an epitaxial wafer, where
Figure 6B:
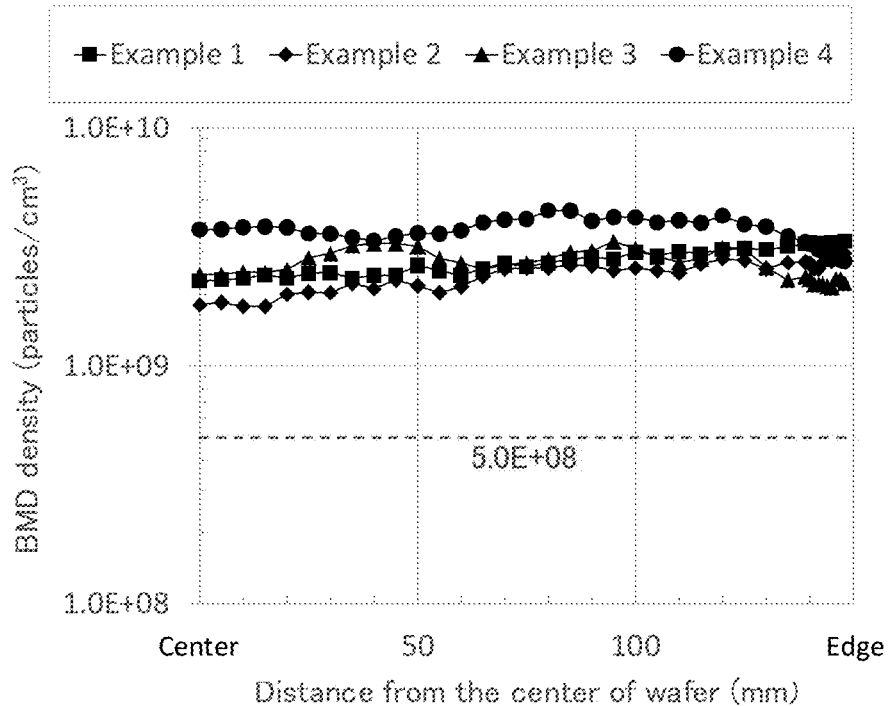

FIGS. 6(a) and 6(b) shows the BMD densities at various locations of the epitaxial wafers. FIG. 6(a) shows the BMD densities for the conventional wafers of Comparative Examples 1 to 3, and FIG. 6(b) shows the BMD densities for the inventive wafers of Examples 1 to 4.

FIG. 6(a) provides BMD densities of three conventional 300 mm wafers as Comparative Examples 1 to 3. Each of these wafers shows a decrease in BMD densities beginning at about 130 mm radially from the center. In contrast, FIG. 6(b) shows that the BMD densities of the wafers of the present invention shown as Examples 1 to 4 remain uniform throughout the wafer from center to edge.

Figure 7:
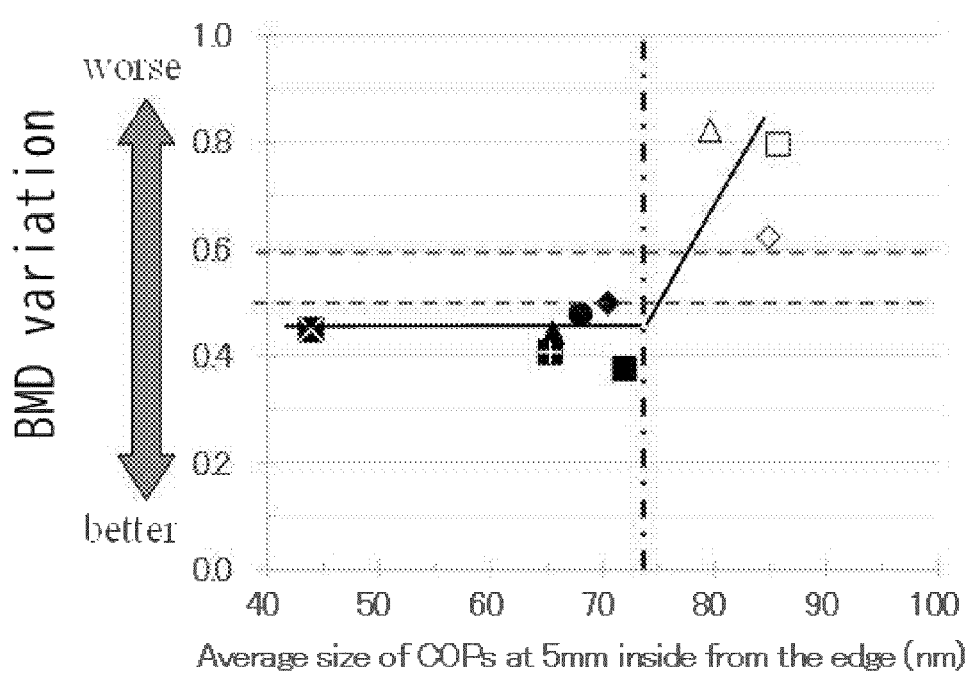
FIG. 7 is a graph showing the relationship between the average COP size and the BMD variation at a position within 5 mm inward from the outermost edge of the wafer.

FIG. 7 shows the relationship between the BMD variation and the average COP sizes at the peripheral region of both the conventional wafers of Comparative Examples 1 to 3 and the inventive wafers of Examples 1 to 4. Conventional wafers are shown as white markers and the inventive wafers as black markers. FIG. 7 illustrates that the conventional wafers having significantly larger average COP sizes result in higher BMD variations that are significantly larger than to preferred 0.6. FIG. 7 illustrates that the inventive wafers having smaller average COP sizes (less than 75 nm) result in much improved BMD variations that are below 0.6. As mentioned above BMD variation (BV) may be computed as Dmax-Dmin/Davg, where Dmax means the maximum BMD density, Dmin means the minimum BMD density, and Davg means the average BMD density.

TABLE 3

| | | Average size of COPs at 5 mm inside from the edge (nm) | In-plane variation of densities of BMDs ((Dmax − Dmin)/Dave) | |
|---|---|---|---|---|
| | | | 0–148 mm from the wafer center | 130–148 mm from the wafer center |
| Example 1 | ■ | 71.9 | 0.375 | 0.077 |
| Example 2 | ♦ | 70.5 | 0.499 | 0.160 |
| Example 3 | ▲ | 65.5 | 0.444 | 0.197 |

TABLE 3-continued

| | | Average size of COPs at 5 mm inside from the edge (nm) | In-plane variation of densities of BMDs ((Dmax − Dmin)/Dave) | |
|---|---|---|---|---|
| | | | 0–148 mm from the wafer center | 130–148 mm from the wafer center |
| Example 4 | ● | 68.0 | 0.478 | 0.348 |
| Example 5 | ■ | 65.3 | 0.407 | 0.225 |
| Example 6 | ✕ | 43.9 | 0.449 | 0.173 |
| Comparative example 1 | □ | 85.7 | 0.796 | 0.385 |
| Comparative example 2 | ◇ | 84.8 | 0.622 | 0.444 |
| Comparative example 3 | △ | 79.6 | 0.822 | 0.780 |

As shown in FIG. 7 and Table 3, the average COP size in the peripheral region of the conventional wafers of Comparative Examples 1 to 3 was 85.7 nm, where each average was larger than 75 nm. The average COP size in the peripheral region of inventive wafer Examples 1 to 6 was 71.9 nm, where each average was smaller than 75 nm.

FIG. 7 further shows that the BMD variation in the bulk region (i.e., the gettering layer 124 in FIG. 12) of the conventional wafers of Comparative Examples 1 to 3 ranged from 0.622 to 0.822. On the other hand, the BMD variation for the inventive wafers of Examples 1 to 6 in the bulk region (i.e., the gettering layer 124) were significantly lower, ranging from 0.375 to 0.499. It shows that the BMD variation of the wafers of the present invention is less than 0.5 in the bulk region.

Table 3 shows that the BMD variation for the conventional wafers of Comparative Examples 1 to 3 ranges from 0.385 to 0.780 in the region (130 to 148 mm radially from the wafer center). The BMD variation for the inventive wafers in the same region (130 to 148 mm) ranges significantly lower at 0.077 to 0.348. It shows that the BMD variation of the wafers of the present invention in this region is less than 0.350 with much improved uniformity over the conventional wafers.

Figure 8A:
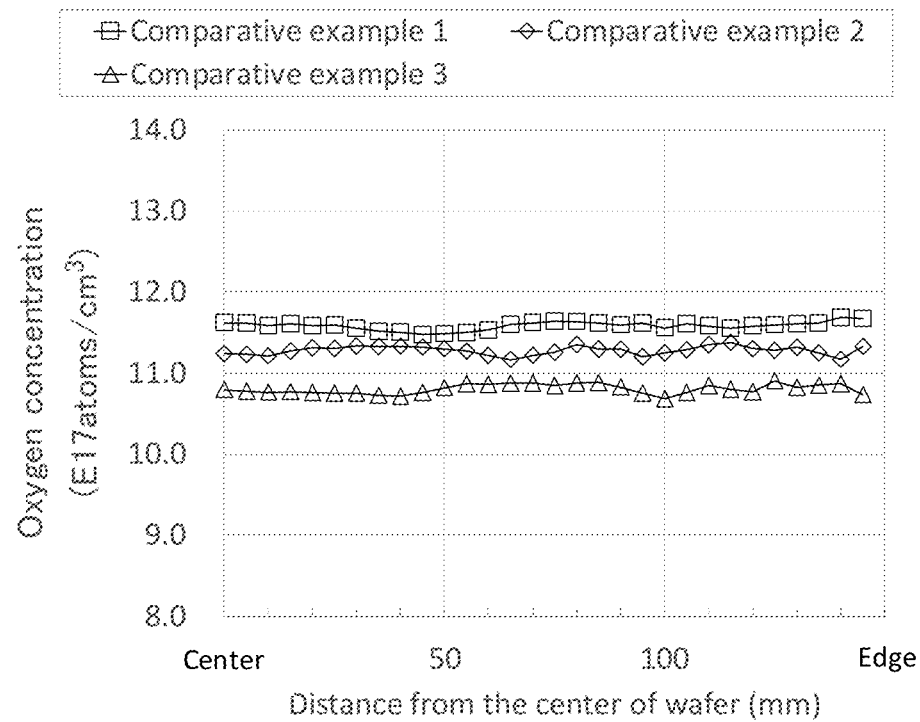
FIG. 8(a) and FIG. 8(b) each show the distribution of the oxygen concentration in an epitaxial wafer before oxygen precipitation evaluation heat treatment, where
Figure 8B:
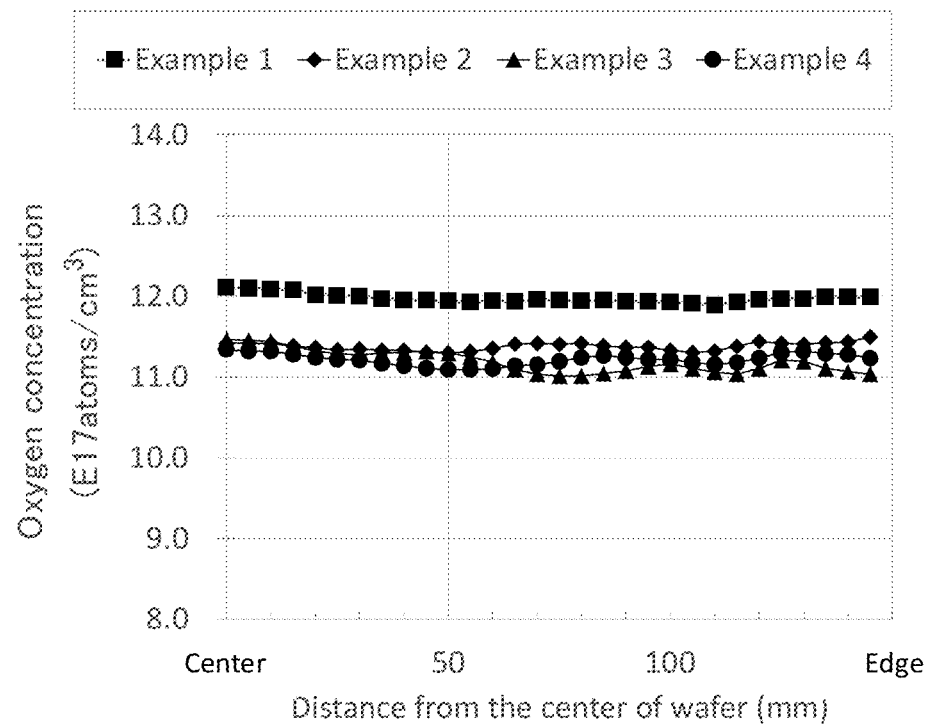

FIGS. 8(a) and 8(b) each show a graph of the distribution of oxygen concentration in epitaxial wafers before the oxygen precipitation evaluation heat treatment. FIG. 8(a) shows the measurement results for epitaxial wafers in Comparative Examples 1 to 3 of conventional wafers, and FIG. 8(b) shows the measurement results for epitaxial wafers of the present invention in Examples 1 to 4.

As shown in FIG. 8(a), the distribution of oxygen concentration in epitaxial wafers for Comparative Examples 1 to 3 was generally uniform, falling within the range of $10.7 \times 10^{17}$ to $11.7 \times 10^{17}$ atoms/cm$^3$. Similarly, as shown in FIG. 8(b), the distribution of oxygen concentration in epitaxial wafers for Examples 1 to 4 was also generally uniform, within the range of $11.0 \times 10^{17}$ to $12.0 \times 10^{17}$ atoms/cm$^3$.

Figure 9A:
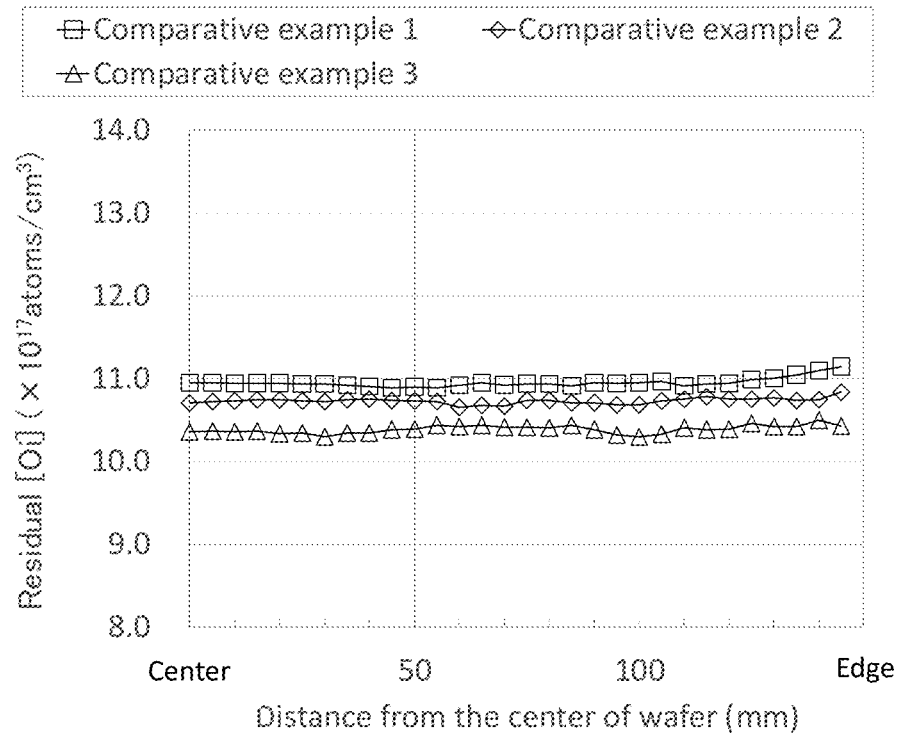
FIG. 9(a) and FIG. 9(b) each show the distribution of the residual oxygen concentration (Oi) in an epitaxial wafer after performing oxygen precipitation evaluation heat treatment to reveal BMD, where
Figure 9B:
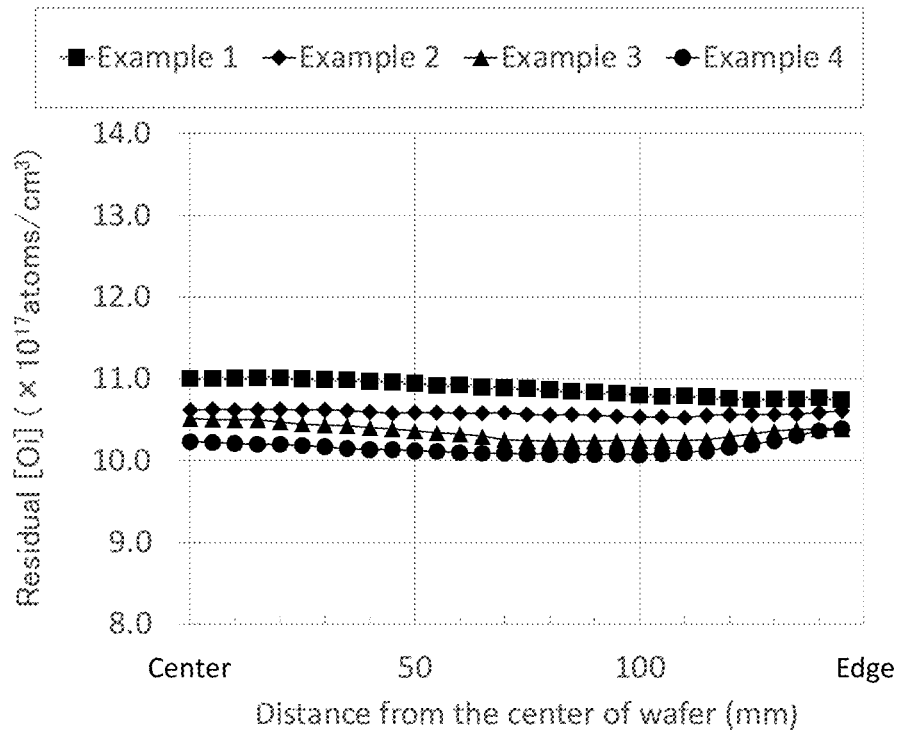

FIGS. 9(a) and 9(b) each show a graph of the distribution of residual oxygen concentration (Oi) in epitaxial wafers after performing oxygen precipitation evaluation heat treatment to make BMD visible. FIG. 9(a) shows the measurement results for epitaxial wafers in Comparative Examples 1 to 3, and FIG. 9(b) shows the measurement results for epitaxial wafers in Examples 1 to 4.

As shown in FIG. 9(a), the distribution of residual Oi concentration in epitaxial wafers for Comparative Examples 1 to 3 was generally uniform, and no decrease in residual Oi concentration was observed in the outer region. Similarly, as shown in FIG. 9(b), the distribution of residual Oi concentration in epitaxial wafers for Examples 1 to 4 was also generally uniform, with no decrease in residual Oi concentration in the outer region. As indicated in FIGS. 6(a) and 6(b), epitaxial wafers in Examples 1 to 4 had increased BMD density in the outer region compared to those in Comparative Examples 1 to 3, raising concerns about decreased residual Oi concentration and potential slip dislocations due to insufficient strength. However, the residual Oi concentration in the peripheral region of epitaxial wafers for Examples 1 to 4 was $10 \times 10^{17}$ atoms/cm$^3$ or higher, ensuring sufficient strength. Therefore, there was no need to worry about slip dislocations due to decreased residual Oi concentration.

Figure 10:
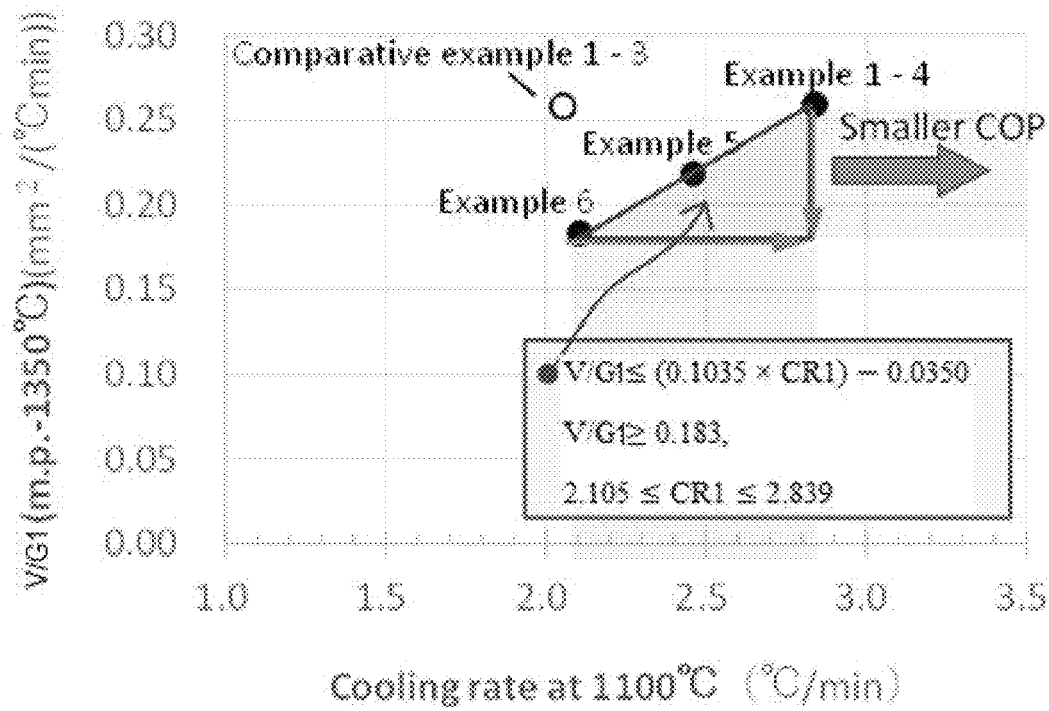
FIG. 10 is a graph showing the region where the average COP size at a position 145 mm from the crystal center axis becomes 75 nm or less on a two-axis graph representing the cooling rate CR2 (° C./min) at 1100° C. of the silicon single crystal and V/G ($mm^2/(° C.·min)$).

FIG. 10 illustrates the relationship between the Voronkov ratio (V/G) and the cooling rate when the crystal reaches 1100° C. at the peripheral region (about 145 mm from the wafer center). The triangle in FIG. 10 depicts an area where the average COP size of 75 nm or less can be obtained. The triangle region was determined from the inventive wafers of Examples 1 to 6 which were obtained from the crystals grown by the preferred methods of the present invention. FIG. 10 further demonstrates that the pulling terms of the conventional crystals include lower cooling rate (as a result of the absence of a cooling system 18) resulting in larger COP sizes for the conventional wafers of Comparative Examples 1 to 3. The larger COP sizes in the peripheral region forces a decrease in the BMD densities. The triangle in FIG. 10 is a representation of V/G and cooling rate terms obtained from the crystals grown by the preferred methods of the present invention which result in inventive wafers of Examples 1 to 6 having smaller COP sizes in the peripheral region.

TABLE 4

| | At 145 mm from the center axis (mm) | | | |
|---|---|---|---|---|
| | Pulling speed (Ratio to the max.)(%) | Cooling rate at 1100° C. (° C./min) | V/G (mm$^2$/(° C. min) | Average size of COPs (nm) |
| Example 1-4 | 83 | 2.839 | 0.259 | 65.5–71.9 |
| Example 5 | 71 | 2.459 | 0.218 | 65.3 |
| Example 6 | 60 | 2.105 | 0.183 | 43.9 |
| Comparative example 1-3 | 100 | 2.054 | 0.258 | 79.6–85.7 |

As shown in FIG. 10 and Table 4, the relationship between the cooling rate CR1 at 1100° C. at about 145 mm from the center axis of the crystal and V/G required to grow the silicon single crystal with an average COP size of 75 nm or less in the peripheral region can be derived from the growth conditions of silicon single crystal according to the methods of the present invention. In Table 4, the crystal pulling speeds are provided as a ratio of the maximum pulling speed. The maximum pulling speed may vary from crystal to crystal and according to the diameters of the crystals, and it refers to the speed (meters/minute) of growing the crystal at the fastest rate without causing any structural damage.

The triangle in FIG. 10 depicts the acceptable V/G1 as a function of CR1 as obtained from the 300 mm wafers of the present invention, shown as Examples 1 to 6. The relationship may be expressed as follows:

$$0.183 \leq V/G1 \leq (0.1035 \times CR1) - 0.0350, \text{ where}$$

$$2.105 \leq CR1 \leq 2.839$$

wherein V represents the pulling speed of the silicon single crystal (mm/min), G1 represents the temperature gradient taken about 145 mm radially from the center axis of the crystal. In particular, G1 is the rate of temperature change in the direction of crystal growth from the silicon melting point to 1350° C. (° C./mm). CR1 represents the cooling rate at 1100° C. of the silicon single crystal (° C./min) at about 145 mm radially from the center axis of the crystal.

Again, FIG. 10 and Table 4 show that the crystals producing the conventional wafers of Comparative Examples 1 to 3 are grown without the use of a cooling system 18 and contain larger COPs. As a result, the conventional wafers of Comparative Examples 1 to 3 include COP sizes that are larger than the preferred size of 75 nm or less and therefore have lower BMD densities in their peripheral regions.

In FIG. 10 and Table 4, it should be noted that V/G1 less than 0.183 would result in low vacancy concentrations in the crystal, and the COPs may not form.

FIG. 10 and Table 4 further illustrate that the cooling rate CR1 at 1100° C. at about 145 mm from the center ranges as follows: 2.105≤CR1≤2.839. If the cooling rate CR1 is less than 2.105, the average COP size may exceed 75 nm. On the other hand, if the cooling rate CR1 exceeds 2.839, the thermal stress within the crystal may cause fracture in the crystal.

The preferred embodiment as illustrated by FIG. 10 and Table 4 demonstrate that controlling the crystal pulling speed and the thermal condition (i.e., cooling rate) within the triangular region contributes to achieving average COP sizes of 75 nm or less in the peripheral region of a resulting wafer.

Figure 11:
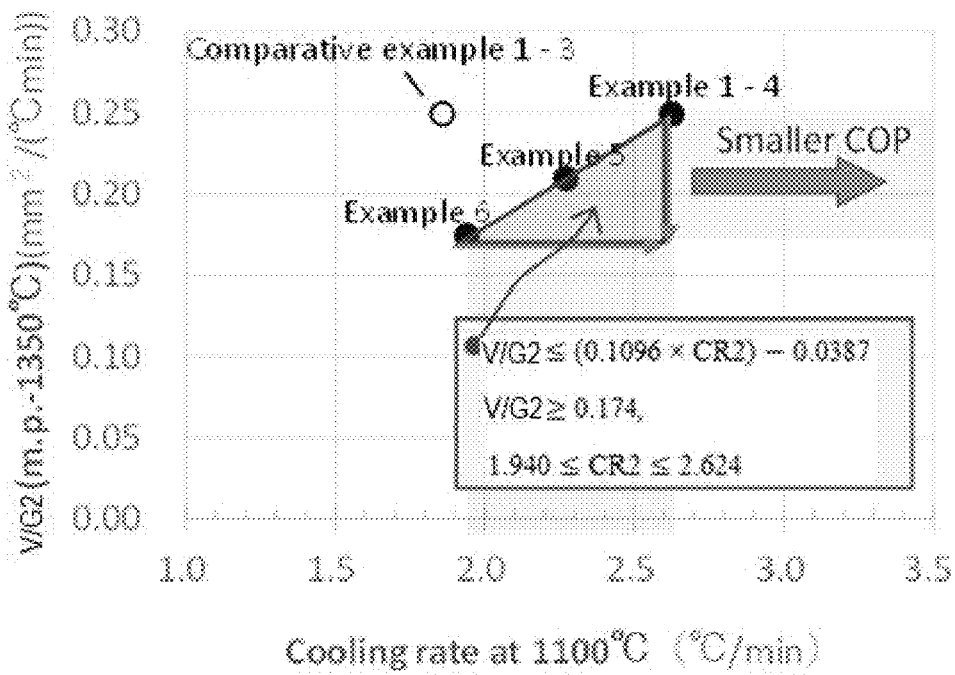
FIG. 11 is a graph showing the region where the average COP size at the crystal center axis becomes 120 nm or less on a two-axis graph representing the cooling rate (° C./min) at 1100° C. of the silicon single crystal and V/G ($mm^2/(° C.·min)$).

FIG. 11 and Table 5 show the relationship between the Voronkov ratio (V/G2) and the cooling rate of the crystal at 1100° C. at the crystal center axis (CR2). Here, the triangle region represents an area where the average COP size is 120 nm or less. This triangle region was determined by the inventive wafers of Examples 1 to 6 of the crystals grown by the preferred methods of the present invention. Table 5 shows that the average COP sizes of the inventive wafers (Examples 1 to 6) range from 76.8 to 119.8 nm. In comparison, Table 5 further shows that the average COP sizes of the conventional wafers of Comparative Examples 1 to 3 range from 141.8 to 145.0 nm and is significantly larger than the preferred 120 nm or less. Table 5 also shows that the cooling rate for the conventional crystals at the center axis (CR2) was significantly lower at 1.858 (due to the absence of the use of a cooling system 18) compared to those of the inventive crystals which range from 1.940 to 2.624. Here again Table 5 shows the pulling speeds relative to the maximum pulling speed.

TABLE 5

| | | at center axis (mm) | | |
|---|---|---|---|---|
| | Pulling speed (Ratio to the max.)(%) | Cooling rate at 1100° C. (° C./min) | V/G (mm²/(° C. min) | Average size of COPs (nm) |
| Example 1-4 | 83 | 2.624 | 0.249 | 103.8-119.8 |
| Example 5 | 71 | 2.271 | 0.209 | 90.7 |
| Example 6 | 60 | 1.94 | 0.174 | 76.8 |
| Comparative example 1-3 | 100 | 1.858 | 0.249 | 141.8-145.0 |

The relationship between the Voronkov ratio V/G2 and the crystal cooling rate CR2 as shown in FIG. 11 and Table 5 was determined from the crystals grown by the preferred methods of the present invention. The determination of the triangular region which represents the average COP size of 120 nm or less is based on the measurements of COP sizes at the center of the inventive wafers taken from these crystals.

The relationship in FIG. 11 may be expressed as follows:

$$0.174 \leq V/G2 \leq (0.1096 \times CR2) - 0.0387, \text{ where}$$

$$1.940 \leq CR2 \leq 2.624$$

wherein V represents the pulling speed of the silicon single crystal (mm/min), G2, similar to G1, represents the temperature gradient about the center axis of the crystal in the direction of the crystal growth from the silicon melting point to 1350° C. (° C./mm). CR2 (° C./min) represents the cooling rate at 1100° C. about the center axis of the crystal.

In FIG. 11 and Table 5, the conventional wafers of Comparative Examples 1 to 3 include larger COPs primarily due to the lack of sufficient cooling rate (1.858, see Table 5). This is due to the fact that these wafers are taken from conventional crystals lacking the use of a cooling system 18.

Further, FIG. 11 shows that V/G2 needs to be 0.174 or greater in order to facilitate formation of COPs for the wafer.

Furthermore, the preferred range of the cooling rate CR2 at 1100° C. at the crystal center axis is: 1.940≤CR2≤2.624. As shown in FIG. 11, CR2 smaller than this range would not facilitate the average COP sizes of 120 nm or less. CR2 larger than the range would cause thermal stress that can cause fracture in the crystal.

From these results, it was determined that controlling the crystal pulling conditions within the triangular region depicted in FIG. 11 provides appropriate crystal pulling conditions to achieve an average COP size of 75-120 nm at the crystal center axis.

By pulling a silicon single crystal under process conditions where the values for cooling rates CR1 and CR2 (° C./min) at 1100° C. and V/G (mm²/(° C.·min)) obtained from furnace heat transfer analysis using numerical simulation fall within the triangular regions shown in FIG. 10 and FIG. 11, it is possible to grow silicon single crystals with an average COP size of 75 nm or less in the peripheral region, and 120 nm or less at the crystal center axis. Process conditions for controlling the values of cooling rates CR1 and CR2 (° C./min) at 1100° C. and V/G (mm²/(° C.·min)) for silicon single crystals include parameters such as the installation of the crystal cooling system 18, pulling speed V, and gap H. Therefore, if the values for cooling rates CR1 and CR2 (° C./min) or V/G (mm²/(° C.·min)) for silicon single crystals obtained from furnace heat transfer analysis using numerical simulation fall outside the triangular regions in FIG. 10 or FIG. 11, adjusting parameters such as the installation of the cooling system, pulling speed V, or gap H can bring the values within the triangular regions.

INDUSTRIAL APPLICABILITY

The epitaxial silicon wafers according to the present invention are widely used as substrate materials for semiconductor devices. Semiconductor devices are incorporated, for example, in smartphones, contributing to their multi-functionality and high performance. For example, the invention enables the simultaneous execution of multiple applications or smooth processing of high-resolution images and videos through enhanced graphics processing capabilities. The present invention promotes the development of various industrial fields, such as the information and communication industry and transportation infrastructure, through semiconductor devices, and can significantly contribute to solving various social and environmental issues.

EXPLANATION OF SYMBOLS

1: Epitaxial silicon wafer
2: Silicon wafer (silicon substrate)
3: Epitaxial silicon film
4: Silicon melt
5: Silicon single crystal
10: Single crystal pulling apparatus
11: Chamber
11a: Main chamber
11b: Pull chamber
11c: Gas inlet
11d: Gas outlet
12: Quartz crucible
13: Carbon susceptor
14: Rotating shaft
15: Shaft drive mechanism
16: Heater
17: Thermal shielding member
18: Cooling system
19: Wire
20: Wire winding mechanism
21: Magnetic field generator
120: epitaxial wafer
121: epitaxial layer
122: silicon substrate
123: first denuded zone
124: gettering layer (bulk region)
125: second denuded zone
E: Edge region of the wafer
H: Gap
OR: Outer region
PO: Center of the wafer
PX: Peripheral region of the wafer
PE: Outermost edge of the wafer
S11: Silicon single crystal growth process
S12: Silicon wafer production process
S13: Epitaxial process

The invention claimed is:

1. An epitaxial wafer comprising a silicon substrate and an epitaxial layer on top of the silicon substrate, the epitaxial wafer further including crystal-originated particles (COPs) throughout the silicon substrate, wherein an average size of COPs in a region within 5 mm radially of a wafer edge is 75 nm or less.

2. The epitaxial wafer of claim 1,
wherein each of the COPs in the silicon substrate, when applied with a laser light, reflects a light intensity, the light intensity corresponds to a diameter of a sphere, the sphere being similar in volume as the COP, and a size of COP being deemed equal to such diameter, and the average size of COPs is equal to an average of 50 or more such diameters.

3. The epitaxial wafer of claim 2,
wherein the average size of COPs at a center of the silicon substrate is 120 nm or less.

4. The epitaxial wafer of claim 1,
wherein the epitaxial wafer has a diameter of 300 mm.

5. The epitaxial wafer of claim 1,
wherein the epitaxial wafer has a diameter of 200 mm.

6. The epitaxial wafer of claim 1, further comprising a nitrogen concentration of $3.0 \times 10^{12}$ to $8.4 \times 10^{13}$ atoms/cm$^3$.

7. An epitaxial wafer comprising a silicon substrate and an epitaxial layer on top of the silicon substrate,
the epitaxial wafer further including crystal-originated particles (COPs) throughout the silicon substrate,
the silicon substrate forming bulk micro defects (BMDs) in a gettering layer when heated, and
a BMD variation of densities of the BMDs throughout the silicon substrate is 0.6 or less.

8. The epitaxial wafer of claim 7,
wherein the BMDs form in the gettering layer when heated to about 780° C. for 3 hours and then about 1000° C. for 16 hours.

9. The epitaxial wafer of claim 7,
wherein the BMD variation means:

$$\text{BMD variation} = (\text{Max BMD} - \text{Min BMD})/\text{Avg BMD},$$
where Max BMD means a maximum density of BMDs,
Min BMD means a minimum density of BMDs, and
Avg BMD means an average density of BMDs, and
where densities of BMDs being measurable from the gettering layer from center to edge of the epitaxial wafer in a radial direction at an interval.

10. The epitaxial wafer of claim 9,
wherein the silicon substrate provides an outer region which is 2 to 11 mm radially from edge of the silicon substrate, and
the interval is 5 mm from center to the outer region and 1 mm within the outer region.

11. The epitaxial wafer of claim 7, further comprising a nitrogen concentration of $3.0 \times 10^{12}$ to $8.4 \times 10^{13}$ atoms/cm$^3$.

12. The epitaxial wafer of claim 7,
wherein the BMD variation is 0.5 or less.

13. The epitaxial wafer of claim 7,
wherein the epitaxial wafer has a diameter of 300 mm.

14. The epitaxial wafer of claim 7,
wherein the epitaxial wafer has a diameter of 200 mm.

15. A method of making an epitaxial wafer of 300 mm in diameter comprising:
providing a silicon melt in a crucible and doping the silicon melt with nitrogen;
pulling a crystal from the silicon melt at a pulling speed of 60 to 90% of a maximum pulling speed, the silicon melt and the crystal forming an interface;
applying a cooling system to the crystal to achieve a cooling rate of 2.1 to 2.8° C./min at an outer portion of the crystal when the outer portion reaches a temperature of about 1100° C., the outer portion being about 145 mm from a center axis of the crystal;

applying a magnetic field of 2000 to 4000 Gauss to the silicon melt;

providing a gap between the silicon melt and a heat shield of 40 to 80 mm;

cutting the crystal into a plurality of silicon substrates; and forming an epitaxial layer on at least one of the silicon substrates;

wherein the maximum pulling speed means a pulling speed beyond which the crystal begins to deform.

16. The method of claim 15, wherein a ratio (V/G) of the pulling speed (V) to a temperature gradient (G) is in a range of 0.183 to 0.218 mm$^2$/° C. min, where G means the temperature gradient abut the outer portion in a direction of growth of the crystal between the temperature at the interface to about 1350° C.

17. The method of claim 16, wherein the ratio (V/G) is set to form COPs throughout the crystal and, further, each silicon substrate includes COPs.

18. The method of claim 15, wherein an average size of COPs in each silicon substrate is 75 nm or less.

19. The method of claim 18, wherein each of the COPs in the silicon substrate, when applied with a laser light, reflects a light intensity, the light intensity corresponds to a diameter of a sphere, the sphere being similar in volume as the COP, and a size of COP being deemed equal to such diameter, and the average size of COPs is equal to an average of 50 or more such diameters.

20. A method of making an epitaxial wafer of 300 mm in diameter comprising:

providing a silicon melt in a crucible and doping the silicon melt with nitrogen;

pulling a crystal from the silicon melt at a pulling speed (V) of 60 to 90% of a maximum pulling speed, the silicon melt and the crystal forming an interface;

applying a cooling system to the crystal to achieve a cooling rate (CR) of 2.105 to 2.839° C./min at an outer portion of the crystal when the outer portion reaches a temperature of about 1100° C., the outer portion being about 145 mm radially from a center axis of the crystal;

applying a magnetic field of 2000 to 4000 Gauss to the silicon melt;

providing a gap between the silicon melt and a heat shield of 40 to 80 mm so as to maintain:

0.183≤V/G≤(0.1035×CR)−0.0350, where 2.105≤CR≤2.839, and where G means the temperature gradient about the outer portion in a direction of growth of the crystal between the temperature at the interface to about 1350° C.;

cutting the crystal into a plurality of silicon substrates; and forming an epitaxial layer on top of at least one of the plurality of silicon substrates;

wherein the maximum pulling speed means a pulling speed beyond which the crystal begins to deform.

21. The method of claim 20, wherein

V/G is set to form COPs throughout the crystal and, the at least one silicon substrate includes COPs.

22. The method of claim 20, wherein an average size of COPs in a region about 145 mm radially from a center of the at least one of the plurality of silicon substrates is 75 nm or less.

23. The method of claim 22, wherein each of the COPs in the silicon substrate, when applied with a laser light, reflects a light intensity, the light intensity corresponds to a diameter of a sphere, the sphere being similar in volume as the COP, and a size of COP being deemed equal to such diameter, and the average size of COPs is equal to an average of 50 or more such diameters.

24. A method of making an epitaxial wafer of 300 mm in diameter comprising:

providing a silicon melt in a crucible and doping the silicon melt with nitrogen;

pulling a crystal from the silicon melt at a pulling speed (V) of 60 to 90% of a maximum pulling speed, the silicon melt and the crystal forming an interface;

applying a cooling system to the crystal to achieve a cooling rate (CR) of 1.940 to 2.624° C./min at a center axis of the crystal when the center axis reaches a temperature of about 1100° C.;

applying a magnetic field of 2000 to 4000 Gauss to the silicon melt;

providing a gap between the silicon melt and a heat shield of 40 to 80 mm so as to maintain:

0.174≤V/G≤(0.1096×CR)−0.0387, where 1.940≤CR≤2.624, and where G means the temperature gradient about the center axis in a direction of growth of the crystal between the temperature at the interface to about 1350° C.;

cutting the crystal into a plurality of silicon substrates; and forming an epitaxial layer on top of at least one of the plurality of silicon substrates;

wherein the maximum pulling speed means a pulling speed beyond which the crystal begins to deform.

25. The method of claim 24, wherein V/G is set to form COPs throughout the crystal and, further, the at least one silicon substrate includes COPs.

26. The method of claim 24, wherein an average size of COPs in a center of the at least one of the plurality of silicon substrates is 120 nm or less.

27. The method of claim 26, wherein each of the COPs in the silicon substrate, when applied with a laser light, reflects a light intensity, the light intensity corresponds to a diameter of a sphere, the sphere being similar in volume as the COP, and a size of COP being deemed equal to such diameter, and the average size of COPs is equal to an average of 50 or more such diameters.

* * * * *